(12) United States Patent
Fujimura et al.

(10) Patent No.: US 12,005,985 B2
(45) Date of Patent: Jun. 11, 2024

(54) COMPONENT FOR HUMAN-POWERED VEHICLE

(71) Applicant: Shimano Inc., Osaka (JP)

(72) Inventors: Shinya Fujimura, Osaka (JP); Hitoshi Takayama, Osaka (JP)

(73) Assignee: Shimano Inc., Osaka (JP)

( * ) Notice: Subject to any disclaimer, the term of this patent is extended or adjusted under 35 U.S.C. 154(b) by 559 days.

(21) Appl. No.: 17/229,142

(22) Filed: Apr. 13, 2021

(65) Prior Publication Data

US 2021/0331760 A1    Oct. 28, 2021

(30) Foreign Application Priority Data

Apr. 23, 2020   (JP) .................. 2020-076936

(51) Int. Cl.
| | | |
|---|---|---|
| *B62J 45/41* | (2020.01) | |
| *B62J 45/20* | (2020.01) | |
| *G01B 7/16* | (2006.01) | |
| *G01K 1/14* | (2021.01) | |
| *H01C 13/00* | (2006.01) | |

(52) U.S. Cl.
CPC ............. *B62J 45/41* (2020.02); *G01B 7/18* (2013.01); *G01K 1/14* (2013.01); *H01C 13/00* (2013.01); *B62J 45/20* (2020.02)

(58) Field of Classification Search
CPC ........... H01C 13/00; B62J 45/41; G01K 1/14; G01B 7/17

See application file for complete search history.

(56) References Cited

U.S. PATENT DOCUMENTS

| | | | | |
|---|---|---|---|---|
| 8,800,389 B2 * | 8/2014 | Tetsuka | .................. | B62J 45/421 |
| | | | | 73/862 |
| 9,322,725 B2 * | 4/2016 | Tetsuka | .................... | B62M 3/00 |
| 9,417,144 B2 * | 8/2016 | Lull | .................... | A63B 24/0087 |

(Continued)

FOREIGN PATENT DOCUMENTS

| | | |
|---|---|---|
| DE | 11 2016 002 445 T5 | 2/2018 |
| JP | 3-276003 A | 12/1991 |

(Continued)

OTHER PUBLICATIONS

JP-2019128183. machine translation. (Year: 2019).*

*Primary Examiner* — Kyung S Lee
(74) *Attorney, Agent, or Firm* — Global IP Counselors, LLP

(57) ABSTRACT

A component is provided for a human-powered vehicle. The component includes a component body, a single substrate, a resistor, an electric wire, a signal processing unit, a signal output, and an electric power input. The single substrate is provided on the component body. The resistor is formed on the single substrate and forms a strain gauge with part of the single substrate. The electric wire is formed on the single substrate and electrically connected to the resistor. The signal processing unit is formed or directly mounted on the single substrate and electrically connected to the electric wire. The signal output outputs a signal from the signal processing unit. The electric power input is electrically connected to the signal processing unit and supplied with electric power from a power supply provided on at least one of the human-powered vehicle and the component body.

22 Claims, 16 Drawing Sheets

(56) References Cited

U.S. PATENT DOCUMENTS

| | | |
|---|---|---|
| 2008/0236293 A1 | 10/2008 | Meggiolan |
| 2011/0203385 A1* | 8/2011 | Huels .................... G01L 1/2287 73/849 |
| 2014/0060212 A1* | 3/2014 | Tetsuka .................. B62J 45/421 73/862.627 |
| 2014/0165744 A1 | 6/2014 | Lull et al. |
| 2017/0176275 A1 | 6/2017 | Tetsuka et al. |
| 2017/0248420 A1* | 8/2017 | Fyfe ........................ B62M 3/16 |
| 2018/0364038 A1 | 12/2018 | Fyfe et al. |
| 2020/0102036 A1* | 4/2020 | Chen .................... G01L 3/1457 |

FOREIGN PATENT DOCUMENTS

| | | | | |
|---|---|---|---|---|
| JP | 2001-272203 A | 10/2001 | | |
| JP | 2005-291999 A | 10/2005 | | |
| JP | 2018-144614 A | 9/2018 | | |
| JP | 2019128183 A | * 8/2019 | ............ | C22C 38/40 |
| WO | 2019/098047 A1 | 5/2019 | | |

* cited by examiner

COMPONENT FOR HUMAN-POWERED VEHICLE

CROSS-REFERENCE TO RELATED APPLICATIONS

This application claims priority to Japanese Patent Application No. 2020-076936, filed on Apr. 23, 2020. The entire disclosure of Japanese Patent Application No. 2020-076936 is hereby incorporated herein by reference.

BACKGROUND

Technical Field

The present disclosure generally relates to a component for a human-powered vehicle.

Background Information

Japanese Laid-Open Patent Publication No. 2018-144614 (Patent Document 1) discloses an example of a human-powered vehicle component including a strain gauge.

SUMMARY

One objective of the present disclosure is to provide a human-powered vehicle component that includes a strain gauge and is suitable for use with a human-powered vehicle.

A component in accordance with a first aspect of the present disclosure is a component for a human-powered vehicle. The component comprises a component body, a single substrate, a resistor, an electric wire, a signal processing unit, a signal output, and an electric power input. The single substrate is provided on the component body. The resistor is formed on the single substrate and forms a strain gauge with part of the single substrate. The electric wire is formed on the single substrate and electrically connected to the resistor. The signal processing unit is formed or directly mounted on the single substrate and electrically connected to the electric wire. The signal output outputs a signal from the signal processing unit. The electric power input is electrically connected to the signal processing unit and supplied with electric power from a power supply provided on at least one of the human-powered vehicle and the component body.

With the component according to the first aspect, the resistor, the electric wire, and the signal processing unit are provided on the single substrate. This decreases the number of parts. Thus, the component according to the first aspect is suitable for use with a human-powered vehicle.

In accordance with a second aspect of the present disclosure, the component according to the first aspect is configured so that the signal processing unit includes at least one of an amplifier and an AD converter.

With the component according to the second aspect, the resistor and the at least one of the amplifier and the AD converter are provided on the single substrate so that the at least one of the amplifier and the AD converter can be disposed close to the resistor. This reduces effect of noise included in a signal output from the resistor.

In accordance with a third aspect of the present disclosure, the component according to the first or second aspect further comprises a temperature sensor formed or mounted on the single substrate.

With the component according to the third aspect, the resistor and the temperature sensor are provided on the single substrate so that the temperature sensor can be disposed close to the resistor. This allows the temperature around the resistor to be accurately detected by the temperature sensor.

In accordance with a fourth aspect of the present disclosure, the component according to the third aspect is configured so that the resistor includes a first resistor and a second resistor. Further, at least part of the temperature sensor is disposed on the single substrate in a region between the first resistor and the second resistor.

With the component according to the fourth aspect, the temperature sensor is disposed on the single substrate in a region between the first resistor and the second resistor so that the temperature sensor accurately detects the temperature around the first resistor and the temperature around the second resistor.

A component in accordance with a fifth aspect of the present disclosure is for a human-powered vehicle. The component comprises a component body, a single substrate, a resistor, a temperature sensor, a signal processing unit, a signal output, and an electric power input. The single substrate is provided on the component body. The resistor is formed on the single substrate and forms a strain gauge with at least part of the single substrate. The temperature sensor is formed or mounted on the single substrate. The signal processing unit is electrically connected to the resistor. The signal output outputs a signal from the signal processing unit. The electric power input is electrically connected to the signal processing unit and supplied with electric power from a power supply provided on at least one of the human-powered vehicle and the component body. The resistor includes a first resistor and a second resistor. The first resistor forms a first strain gauge with a first portion of the single substrate. The second resistor forms a second strain gauge with a second portion of the single substrate. At least part of the temperature sensor is disposed on the single substrate in a region between the first resistor and the second resistor on the single substrate at a connecting portion connecting the first portion and the second portion.

With the component according to the fifth aspect, at least part of the temperature sensor is disposed on the single substrate in a region between the first resistor and the second resistor on the single substrate at the connecting portion connecting the first portion and the second portion so that the temperature sensor accurately detects the temperature around the first resistor and the temperature around the second resistor. Thus, the component according to the fifth aspect is suitable for use with a human-powered vehicle.

In accordance with a sixth aspect of the present disclosure, the component according to any one of the third to fifth aspects is configured so that at least part of the temperature sensor is arranged to overlap at least part of resistor as viewed in a thickness direction of the single substrate.

With the component according to the sixth aspect, at least part of the temperature sensor is arranged to overlap at least part of the resistor as viewed in the thickness direction of the single substrate so that the temperature sensor can be disposed close to the resistor. This allows the temperature around the resistor to be accurately detected by the temperature sensor. The component according to the sixth aspect allows the single substrate to be reduced in size.

In accordance with a seventh aspect of the present disclosure, the component is for a human-powered vehicle. The component comprises a component body, a single substrate, a resistor, a temperature sensor, a signal processing unit, a signal output, and an electric power input. The single substrate is provided on the component body. The resistor is formed on the single substrate and forms a strain gauge with part of the single substrate. The temperature sensor is formed or mounted on the single substrate and disposed to at least partially overlap the resistor as viewed in a thickness direction of the single substrate. The signal processing unit is electrically connected to the resistor. The signal output outputs a signal from the signal processing unit. The electric power input is electrically connected to the signal processing unit and supplied with electric power from a power supply provided on at least one of the human-powered vehicle and the component body.

With the component according to the seventh aspect, at least part of the temperature sensor is disposed overlapping at least part of the resistor as viewed in the thickness direction of the single substrate so that the temperature sensor can be disposed close to the resistor. Thus, the temperature sensor accurately detects the temperature around the resistor and is suitable for use with a human-powered vehicle. The component according to the seventh aspect allows the single substrate to be reduced in size.

A component in accordance with an eighth aspect of the present disclosure is for a human-powered vehicle. The component comprises a component body, a strain gauge, an electric circuit board, a flexible printed wiring board, a temperature sensor, a signal processing unit, a signal output, and an electric power input. The strain gauge is provided on the component body. The flexible printed wiring board electrically connects the strain gauge and the electric circuit board. The temperature sensor is provided on at least one of the flexible printed wiring board, a first connecting portion to which the strain gauge and the flexible printed wiring board are connected, and a second connecting portion to which the flexible printed wiring board and the electric circuit board are connected. The signal processing unit is electrically connected to the strain gauge. The signal output outputs a signal from the signal processing unit. The electric power input is electrically connected to the signal processing unit and supplied with electric power from a power supply provided on at least one of the human-powered vehicle and the component body.

With the component according to the eighth aspect, the temperature sensor is provided on at least one of the flexible printed wiring board, the first connecting portion, and the second connecting portion. This allows the temperature sensor to be disposed closer to the resistor than a case where the temperature sensor is provided on the electric circuit board. The component according to the eighth aspect readily detects the temperature around the resistor with the temperature sensor. Thus, the component according to the eighth aspect is suitable for use with a human-powered vehicle.

In accordance with a ninth aspect of the present disclosure, the component according to the eighth aspect is configured so that the temperature sensor is provided on the flexible printed wiring board. The strain gauge includes a resistor and a first thermal conductor that is electrically insulated from the resistor. The flexible printed wiring board includes a second thermal conductor connected to the first thermal conductor. The temperature sensor is disposed in contact with or proximate to the second thermal conductor.

With the component according to the ninth aspect, the temperature of the strain gauge is conducted by the first thermal conductor and the second thermal conductor. Thus, even in a case where the temperature sensor is disposed on the flexible printed wiring board, the temperature sensor accurately detects the temperature around the resistor.

In accordance with a tenth aspect of the present disclosure, the component according to the eighth or ninth aspect further comprises at least one of an amplifier and an AD converter. Further, the at least one of the amplifier and the AD converter is electrically connected to the strain gauge and provided on at least one of the flexible printed wiring board, the first connecting portion, and the second connecting portion.

With the component according to the tenth aspect, at least one of the amplifier and the AD converter is provided on at least one of the flexible printed wiring board, the first connecting portion, and the second connecting portion. This allows the at least one of the amplifier and the AD converter to be disposed close to the resistor. This reduces effect of noise included in a signal output from the resistor.

A component according to an eleventh aspect of the present disclosure is for a human-powered vehicle. The component comprises a component body, a strain gauge, an electric circuit board, a flexible printed wiring board, at least one of an amplifier and an AD converter, a signal processing unit, a signal output, and an electric power input. The strain gauge is provided on the component body. The flexible printed wiring board electrically connects the strain gauge and the electric circuit board. The at least one of an amplifier and an AD converter is electrically connected to the strain gauge and provided on at least one of the flexible printed wiring board, a first connecting portion to which the strain gauge and the flexible printed wiring board are connected, and a second connecting portion to which the flexible printed wiring board and the electric circuit board are connected. The signal processing unit is provided on the electric circuit board and electrically connected to the at least one of the amplifier and the AD converter. The signal output outputs a signal from the signal processing unit. The electric power input is electrically connected to the signal processing unit and the at least one of the amplifier and the AD converter and supplied with electric power from a power supply provided on at least one of the human-powered vehicle and the component body.

With the component according to the eleventh aspect, at least one of the amplifier and the AD converter is provided on at least one of the flexible printed wiring board, the first connecting portion, and the second connecting portion. This allows the at least one of the amplifier and the AD converter to be disposed close to the resistor. The component according to the eleventh aspect reduces effect of noise included in a signal output from the resistor. Thus, the component according to the eleventh aspect is suitable for use with a human-powered vehicle.

In accordance with a twelfth aspect of the present disclosure, the component according to any one of the first to third aspects is configured so that the electric wire has a lower electrical resistance per unit length than the resistor.

With the component according to the twelfth aspect, the electric wire has a lower electrical resistance per unit length than the resistor. This avoids loss of a signal output from the strain gauge in the electric wire.

A component in accordance with a thirteenth aspect of the present disclosure is for a human-powered vehicle. The component comprises a component body, a single substrate, a resistor, an electric wire, a signal processing unit, a signal output, and an electric power input. The single substrate is provided on the component body. The resistor is formed on the single substrate and forms a strain gauge with part of the single substrate. The electric wire is formed on the single substrate and electrically connected to the resistor. The signal processing unit is mounted on the single substrate and electrically connected to the electric wire. The signal output outputs a signal from the signal processing unit. The electric power input is electrically connected to the signal processing unit and supplied with electric power from a power supply provided on at least one of the human-powered vehicle and the component body. The electric wire has a lower electrical resistance per unit length than the resistor.

With the component according to the thirteenth aspect, the electric wire has a lower electrical resistance per unit length than the resistor. This avoids loss of a signal output from the strain gauge in the electric wire. Thus, the component according to the thirteenth aspect is suitable for use with a human-powered vehicle.

In accordance with a fourteenth aspect of the present disclosure, the component according to the twelfth or thirteenth aspect is configured so that the resistor and the electric wire have different compositions.

With the component according to the fourteenth aspect, the resistor and the electric wire have different compositions. Thus, the electrical resistance per unit length of the electric wire can be lower than that of the resistor. The component according to the fourteenth aspect allows each of the resistor and the electric wire to be formed from a suitable material.

In accordance with a fifteenth aspect of the present disclosure, the component according to the thirteenth aspect is configured so that the electric wire includes a first wire portion and a second wire portion that covers the first wire portion. Further, the resistor is molded integrally with the first wire portion of the electric wire. Furthermore, the second wire portion has a lower electrical resistivity than the resistor and the first wire portion.

With the component according to the fifteenth aspect, the second wire portion has a lower electrical resistivity than the resistor and the first wire portion. Thus, the electrical resistance per unit length of the electric wire is lower than that of the resistor.

In accordance with a sixteenth aspect of the present disclosure, the component according to the fourteenth or fifteenth aspect is configured so that the resistor includes at least one of CuNi, Ni, and NiCr. Further, at least part of the electric wire includes Cu.

With the component according to the sixteenth aspect, the resistor includes at least one of CuNi, Ni, and NiCr, and at least part of the electric wire includes Cu. Thus, the electrical resistance per unit length of the electric wire can be lower than that of the resistor.

In accordance with a seventeenth aspect of the present disclosure, the component according to any one of the first to third and thirteenth to sixteenth aspects is configured so that the single substrate includes a first setting surface and a second setting surface that are spaced apart in a thickness direction. Further, the resistor is provided on the first setting surface. Furthermore, at least part of the electric wire is provided on the second setting surface.

With the component according to the seventeenth aspect, in a case where the resistor and at least part of the electric wire are formed from different materials, the resistor and the at least part of the electric wire can be readily formed in different manufacturing processes.

In accordance with an eighteenth aspect of the present disclosure, the component according to the seventeenth aspect is configured so that the single substrate includes a connection hole that connects the first setting surface and the second setting surface. Further, part of the electric wire is provided in the connection hole.

The component according to the eighteenth aspect facilitates the electric connection of the electric wire to the resistor.

In accordance with a nineteenth aspect of the present disclosure, the component according to any one of the first to seventh and thirteenth to eighteenth aspects is configured so that the single substrate includes an insulative and flexible resin film.

With the component according to the nineteenth aspect, the single substrate is readily shaped in correspondence with the component.

In accordance with a twentieth aspect of the present disclosure, the component according to any one of the first to nineteenth aspects is configured so that the signal output includes a wireless transmission device that transmits information corresponding to a signal from the signal processing unit through wireless connection.

The component according to the twentieth aspect allows the information corresponding to a signal from the signal processing unit to be transmitted by the wireless transmission device to an external device.

In accordance with a twenty-first aspect of the present disclosure, the component according to any one of the first to twentieth aspects further comprises a processor provided on at least one of the component body and the signal processing unit. The processor is configured to calculate information related to force applied to the component body.

The component according to the twenty-first aspect allows the information related to force applied to the component body to be calculated by the processor.

In accordance with a twenty-second aspect of the present disclosure, the component according to the twenty-first aspect further comprises an operating unit provided on the component body to input a reset signal to the processor.

The component according to the twenty-second aspect allows a reset signal to be input to the processor by operating the operating portion.

In accordance with a twenty-third aspect of the present disclosure, the component according to any one of the first to twenty-second aspects further comprises a rotational state detector that detects a rotational state of at least part of the component body.

The component according to the twenty-third aspect allows the rotational state of at least part of the component body to be detected by the rotational state detector.

In accordance with a twenty-fourth aspect of the present disclosure, the component according to any one of the first to twenty-third aspects further comprises a notification device provided on the component body. The notification device includes at least one of a light generation device and a sound generation device.

The component according to the twenty-fourth aspect allows a user to be notified with information by the notification device that includes at least one of the light generation device and the sound generation device.

In accordance with a twenty-fifth aspect of the present disclosure, the component according to any one of the first to twenty-fourth aspects further comprises a cover provided on the component body to define a sealed space in which at least the strain gauge and the signal processing unit are disposed.

With the component according to the twenty-fifth aspect, the cover can avoid foreign matter from collecting on the strain gauge and the signal processing unit.

In accordance with a twenty-sixth aspect of the present disclosure, the component according to any one of the first to twenty-fifth aspects is configured so that the component body includes at least one of a crank assembly, a crank arm, a crank axle, a pedal, a frame, a handlebar, a stem, a front fork, a seatpost, a saddle, a wheel, a hub, a carrier, and a drive unit configured to apply a propulsion force to the human-powered vehicle.

With the component according to the twenty-sixth aspect, the component that includes the component body including at least one of the crank assembly, the crank arm, the crank axle, the pedal, the frame, the handlebar, the stem, the front fork, the seatpost, the saddle, the wheel, the hub, the carrier, and the drive unit is suitable for use with a human-powered vehicle.

The human-powered vehicle component in accordance with the present disclosure includes a strain gauge and is suitable for use with a human-powered vehicle.

BRIEF DESCRIPTION OF THE DRAWINGS

Referring now to the attached drawings which form a part of this original disclosure.

DETAILED DESCRIPTION OF EMBODIMENTS

Figure 1:
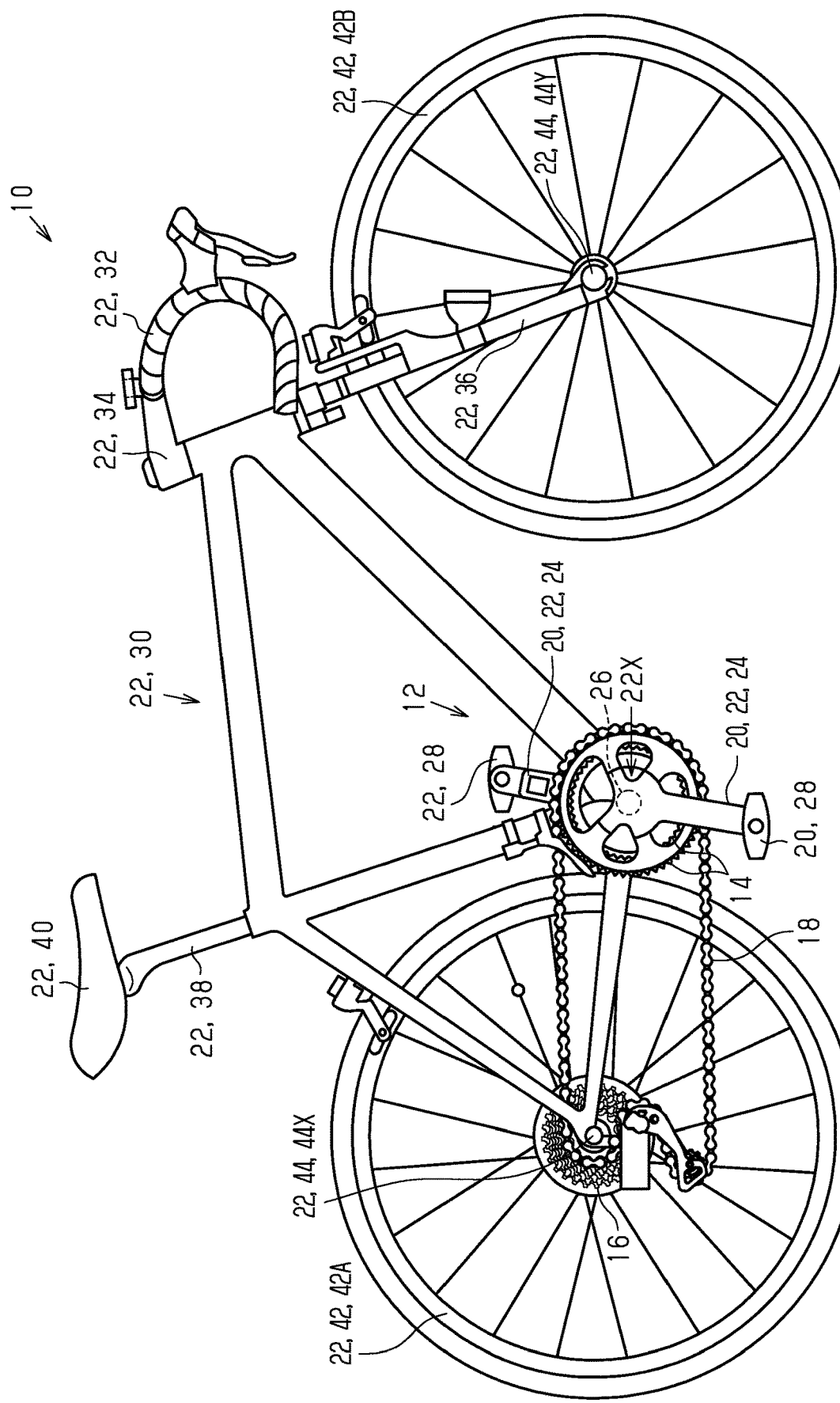
FIG. 1 is a side elevational view of a human-powered vehicle including a human-powered vehicle component in accordance with one illustrated embodiment.
Figure 2:
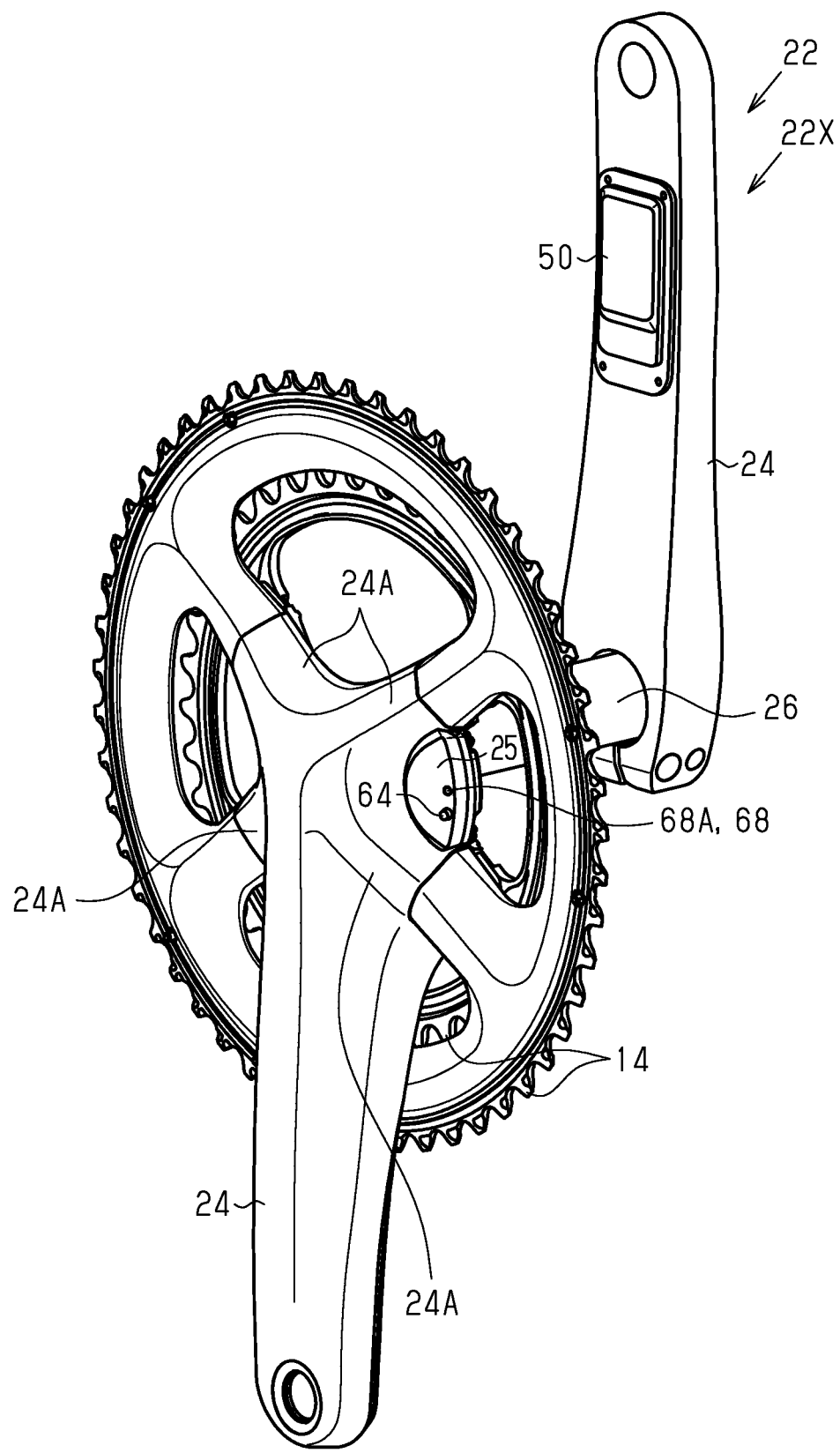
FIG. 2 is a perspective view showing an example of the human-powered vehicle component in accordance with the illustrated embodiment.
Figure 3:
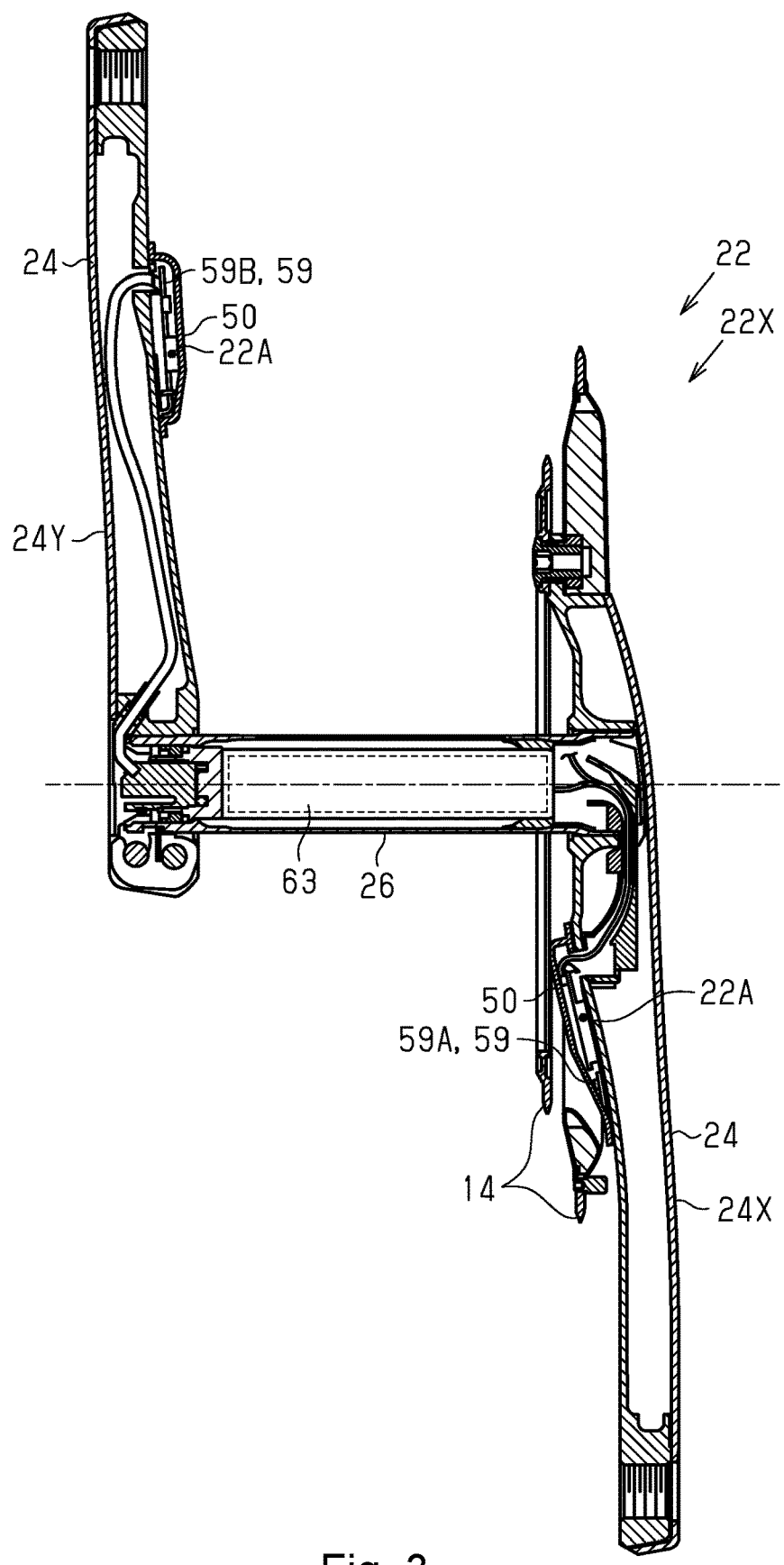
FIG. 3 is a cross-sectional view of the human-powered vehicle component shown in FIG. 2.
Figure 4:
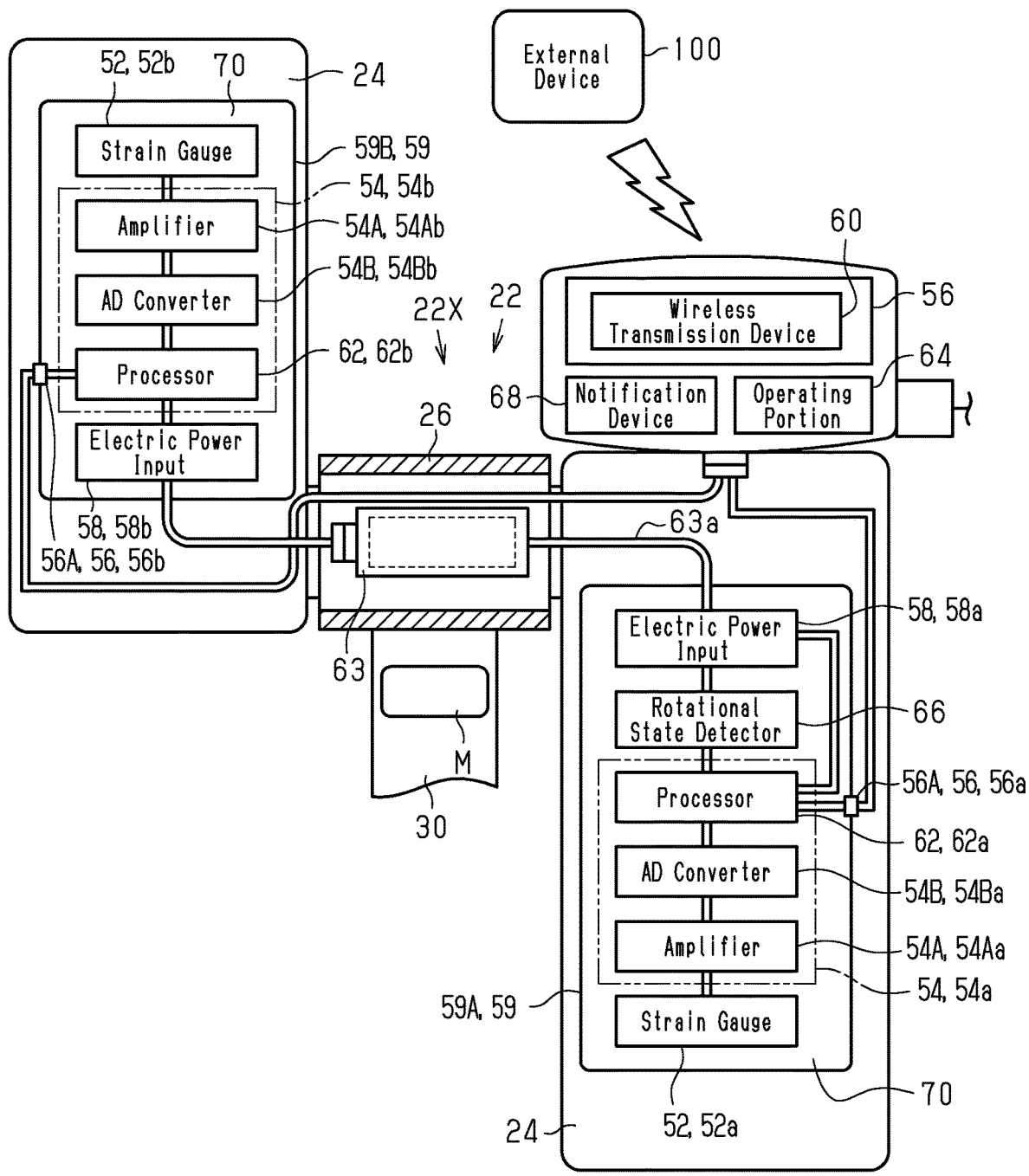
FIG. 4 is a block diagram showing the electrical structure of the human-powered vehicle component shown in FIG. 2 and an external device.

Selected embodiments will now be explained with reference to the drawings. It will be apparent to those skilled in the bicycle field from this disclosure that the following descriptions of the embodiments are provided for illustration only and not for the purpose of limiting the invention as defined by the appended claims and their equivalents.

Embodiment

A human-powered vehicle component 20 in accordance with one embodiment will now be described with reference to FIGS. 1 to 24. A human-powered vehicle 10 is a vehicle that includes at least one wheel and can be driven by at least human driving force. Examples of the human-powered vehicle 10 include various types of bicycles such as a mountain bike, a road bike, a city bike, a cargo bike, a handbike, and a recumbent bike. There is no limit to the number of wheels of the human-powered vehicle 10. The human-powered vehicle 10 also includes, for example, a unicycle or a vehicle having three or more wheels. The human-powered vehicle 10 is not limited to a vehicle that can be driven only by human driving force. The human-powered vehicle 10 includes an electric bicycle (E-bike) that uses drive force of an electric motor for propulsion in addition to human driving force. The E-bike includes an electric assist bicycle that assists in propulsion with an electric motor. In the embodiment described hereafter, the human-powered vehicle 10 will be described as a bicycle, and one example of the bicycle is a road bike. The human-powered vehicle 10 in accordance with the present embodiment includes a crank assembly 22X, a pair of pedal 28, a frame 30, a handlebar 32, a stem 34, a front fork 36, a seatpost 38, a saddle 40, a pair of wheel 42, and a pair of hub 44. However, the number of pedals, wheel and hubs depends on the configuration of the human-powered vehicle 10. The crank assembly 22X includes at least one crank arm 24 and a crank axle 26. In the present embodiment, the crank assembly 22X includes two crank arms 24 and the crank axle 26.

The human-powered vehicle component 20 is provided on the human-powered vehicle 10. The component 20 includes a component body 22. In the present embodiment, the component body 22 includes the crank assembly 22X.

The human driving force is input to the crank arms 24 and the crank axle 26. In the present embodiment, the wheel 42 includes a rear wheel 42A and a front wheel 42B. The crank axle 26 is rotatable relative to the frame 30. Two crank arms 24 are provided on two axial ends of the crank axle 26, respectively. Two pedals 28 are connected to the two crank arms 24, respectively. The rear wheel 42A is driven by the rotation of the crank axle 26. The rear wheel 42A is supported by the frame 30. The crank axle 26 is connected to the rear wheel 42A by a drive mechanism 12. The drive mechanism 12 includes a first rotational body 14 connected to the crank axle 26. The crank axle 26 is coupled to the first rotational body 14 in an integrally rotatable manner. The first rotational body 14 includes a sprocket, a pulley, or a bevel gear. The drive mechanism 12 further includes a second rotational body 16 and a linking member 18. The linking member 18 transmits the rotational force of the first rotational body 14 to the second rotational body 16. The linking member 18 includes, for example, a chain, a belt, or a shaft.

The second rotational body 16 is connected to the rear wheel 42A. The second rotational body 16 includes a sprocket, a pulley, or a bevel gear. Preferably, a first one-way clutch is provided between the second rotational body 16 and the rear wheel 42A. The first one-way clutch is configured to rotate the rear wheel 42A forward in a case where the second rotational body 16 is rotated forward and allow relative rotation of the second rotational body 16 and the rear wheel 42A in a case where the second rotational body 16 is rotated rearward. In the present embodiment, the first rotational body 14 and the second rotational body 16 each include a sprocket, and the linking member 18 includes a chain. In a case where the first rotational body 14 includes a sprocket, the first rotational body 14 includes one or more sprockets. In a case where the second rotational body 16 includes a sprocket, the second rotational body 16 includes one or more sprockets. The human-powered vehicle 10 can further include a transmission. The transmission includes at least one of a front derailleur, a rear derailleur, and an internal transmission device. In the present embodiment, the first rotational body 14 includes, for example, two sprockets. In the present embodiment, the second rotational body 16 includes, for example, twelve sprockets. In the present embodiment, the human-powered vehicle 10 includes a front derailleur and a rear derailleur. In a case where the human-powered vehicle 10 includes an internal transmission device, the internal transmission device is provided on at least one of the hub of the rear wheel 42A and a power transmission path between the crank axle 26 and the first rotational body 14.

The vehicle body of the human-powered vehicle 10 includes the frame 30, the handlebar 32, the stem 34, the front fork 36, and the seatpost 38. The frame 30 of the present embodiment is a diamond-shaped frame. Instead, the frame 30 can be shaped to be a stagger frame or a parallel frame. The shape of the frame 30 is not limited and can be changed. The front wheel 42B is attached to the frame 30 by the front fork 36. The handlebar 32 is connected to the front fork 36 by the stem 34. The handlebar 32 of the present embodiment is a drop handlebar but can have a different form like a flat handlebar. The shape of the handlebar 32 is not limited and can be changed. The shape of the stem 34 is not limited and can be changed. In the present embodiment, the handlebar 32 and the stem 34 are separate members. Alternatively, the handlebar 32 and the stem 34 can be integrated into a one-piece structure. The shape of the front fork 36 is not limited and can be changed. The front fork 36 can be configured to, for example, function as a suspension, hold two ends of the rotational shaft of the front wheel 42B, or hold only one end of the rotational shaft of the front wheel 42B. The shape of the seatpost 38 is not limited and can be changed. The seatpost 38 can be an adjustable seatpost such that the height of the saddle is adjustable by at least one of a hydraulic actuator, a pneumatic actuator, and an electric actuator. In the present embodiment, the rear wheel 42A is coupled to the crank axle 26 by the drive mechanism 12. Alternatively, at least one of the rear wheel 42A and the front wheel 42B can be coupled to the crank axle 26 by the drive mechanism 12.

The hub 44 is provided at the rotational center of the wheel 42. The hub 44 includes a rear hub 44X provided at the rotational center of the rear wheel 42A and a front hub 44Y provided at the rotational center of the front wheel 42B. The rear hub 44X can include a first one-way clutch. The rear hub 44X can include an internal transmission device.

The component 20 includes the component body 22, a strain gauge 52, a signal processing unit 54, a signal output 56, and an electric power input 58. The signal processing unit 54 is electrically connected to the strain gauge 52. The signal output 56 outputs a signal from the signal processing unit 54. The electric power input 58 is electrically connected to the signal processing unit 54 and supplied with electric power from a power supply 63 provided on at least one of the human-powered vehicle 10 and the component body 22.

Preferably, the component 20 further includes a cover 50 provided on the component body 22 and defining a sealed space 22A. The sealed space 22A is a space surrounded by the cover 50 and the component body 22. At least the strain gauge 52 and the signal processing unit 54 are disposed in the sealed space 22A. Preferably, the strain gauge 52, at least part of the signal processing unit 54, and the electric power input 58 are disposed in the sealed space 22A. The signal output 56 can be disposed outside the sealed space 22A or in the sealed space 22A. The cover 50 is, for example, adhered to the component body 22. The cover 50 can be attached to the component body 22 in a detachable manner. The cover 50 is formed from, for example, a resin.

In the present embodiment, the power supply 63 is provided on the component body 22. In the crank assembly 22X shown in FIGS. 2 to 4, the power supply 63 is disposed inside the crank axle 26. The crank axle 26 is cylindrical. The power supply 63 is disposed inside the crank axle 26. The power supply 63 can be, for example, provided on the crank arm 24 instead of the crank axle 26. For example, in a case where the crank arm 24 is hollow, the power supply 63 can be disposed inside the crank arm 24. The power supply 63 can be disposed anywhere. For example, the crank arm 24 can include a case 25, and the power supply 63 can be disposed in the case 25. The case 25 is provided, for example, on an outer surface of the crank arm 24. The case 25 is provided, for example, between two adjacent legs of a spider 24A in a rotational direction of the crank arm 24. The case 25 is, for example, fastened to the crank arm 24 by bolts. The power supply 63 can be disposed in the sealed space 22A.

The power supply 63 includes one or more battery cells. Each battery cell includes, for example, a rechargeable battery. Instead of a rechargeable battery, each battery cell can include a battery such as a coin cell that only discharges electric power. The power supply 63 is configured to supply the strain gauge 52 and the signal processing unit 54 with electric power through the electric power input 58. Preferably, the power supply 63 is provided on the component body 22 in a removable manner. The electric power input 58 includes at least one of an electric terminal, an electric cable, and an electric connector. The power supply 63 supplies the signal processing unit 54 with electric power, for example, through the electric power input 58 and an electric cable 63a. The electric cable 63a can be replaced by a flexible wiring board.

Preferably, the component 20 further includes at least one of an amplifier 54A and an analog/digital (AD) converter 54B. Preferably, the signal processing unit 54 includes at least one of the amplifier 54A and the AD converter 54B. Preferably, the component 20 includes both the amplifier 54A and the AD converter 54B. The amplifier 54A is electrically connected to the strain gauge 52, and configured to amplify a signal output from the strain gauge 52. The AD converter 54B is electrically connected to the strain gauge 52, and configured to convert an analog signal output from the strain gauge 52 into a digital signal. Preferably, a signal output from the strain gauge 52 is amplified by the amplifier 54A, and then input to the AD converter 54B. Preferably, the digital signal generated by the AD converter 54B is input to a processor 62.

Preferably, the signal output 56 includes at least one of an electric terminal 56A, an electric cable, and an electric connector. Preferably, the signal output 56 includes a wireless transmission device 60 that transmits information corresponding to a signal from the signal processing unit 54 through wireless connection. Preferably, the wireless transmission device 60 is configured to establish wireless communication with an external device 100. The wireless transmission device 60 is, for example, electrically connected to the electric terminal 56A by an electric cable. In a case where the wireless transmission device 60 is provided on a single substrate 70, which will be described later, the wireless transmission device 60 can be directly connected to an electric wire formed on the single substrate 70 without the electric terminal 56A or the electric cable. The wireless transmission device 60 is configured to perform communication through, for example, at least one of Bluetooth®, ANT+®, Wi-Fi®, and infrared communication. The wireless transmission device 60 can transmit information through a unique communication protocol. In the present embodiment, the wireless transmission device 60 is disposed in the case 25. The case 25 is formed from, for example, a resin. The wireless transmission device 60 can be disposed in the sealed space 22A.

Preferably, the external device 100 includes a display. The external device 100 includes, for example, at least one of an operation device of the human-powered vehicle 10, a cycle computer, a smartphone, a tablet computer, and a personal computer. The signal output 56 can be connected to the external device 100 by an electric cable and configured to communicate with the external device 100. In a case where the signal output 56 is connected to the external device 100 by an electric cable, the signal output 56 includes, for example, a connector. The external device 100 is configured to display information transmitted from the wireless transmission device 60.

Preferably, the component 20 includes the processor 62 provided on at least one of the component body 22 and the signal processing unit 54. Preferably, the processor 62 is configured to calculate information related to force applied to the component body 22. The processor 62 includes, for example, a central processing unit (CPU) or a micro-processing unit (MPU). Multiple processors 62 can be located at separate positions. The processor 62 can include one or more microcomputers. Preferably, the processor 62 further includes computer storage. The computer storage stores various types of control programs and information used for various types of control processes. The computer storage can store a processing result of the processor 62. The computer storage includes, for example, a nonvolatile memory and a volatile memory. The non-volatile memory includes, for example, at least one of a read-only memory (ROM), an erasable programmable read-only memory (EPROM), an electrically erasable programmable read-only memory (EEPROM), and a flash memory. The volatile memory includes, for example, a random-access memory (RAM). Thus, the computer storage is any computer storage device or any non-transitory computer-readable medium with the sole exception of a transitory, propagating signal. The signal output 56 can be configured to output the processing result of the processor 62 stored in the computer storage.

The processor 62 calculates, for example, force applied to the component body 22 from the output of the strain gauge 52. In the present embodiment, the processor 62 calculates the human driving force input to the crank arm 24 from the output of the strain gauge 52. Preferably, a signal output from the strain gauge 52 is amplified by the amplifier 54A, converted into a digital signal by the AD converter 54B, and then input to the processor 62. The human driving force calculated by the processor 62 is, for example, used for various types of controls in at least one of the external device 100, the component body 22, and a human-powered vehicle component differing from the component body 22. For example, in a case where the external device 100 includes a display, the display shows information related to the human driving force. The human driving force calculated by the processor 62 can be used, for example, to control output of a drive unit configured to apply a propulsion force to the human-powered vehicle 10 or to control the transmission of the human-powered vehicle.

In the present embodiment, the two crank arms 24 each include the strain gauge 52, the signal processing unit 54, the signal output 56, and the electric power input 58. The two crank arms 24 include a first crank arm 24X and a second crank arm 24Y. The first crank arm 24X is arranged at a position closer to the first rotational body 14 than the second crank arm 24Y. Hereinafter, the strain gauge 52, the signal processing unit 54, the signal output 56, and the electric power input 58 included in the first crank arm 24X can be referred to as the first strain gauge 52a, the first signal processing unit 54a, the first signal output 56a, and the first electric power input 58a, respectively. Hereinafter, the strain gauge 52, the signal processing unit 54, the signal output 56, and the electric power input 58 included in the second crank arm 24Y can be referred to as the second strain gauge 52b, the second signal processing unit 54b, the second signal output 56b, and the second electric power input 58b, respectively. The amplifier 54A, the AD converter 54B, and the processor 62 included in the first signal processing unit 54a can be referred to as the first amplifier 54Aa, the first AD converter 54Ba, and the first processor 62a, respectively. The amplifier 54A, the AD converter 54B, and the processor 62 included in the second signal processing unit 54b can be referred to as the second amplifier 54Ab, the second AD converter 54Bb, and the second processor 62b, respectively. The second processor 62b does not have to calculate the human driving force input to the crank arm 24 from the output of the strain gauge 52, and can be configured to transmit a signal output from the second AD converter 54Bb to the first processor 62a. In this case, the first processor 62a can calculate the human driving force input to the first crank arm 24X from the output of the first strain gauge 52a, and can calculate the human driving force input to the second crank arm 24Y from the output of the second strain gauge 52*b*. The second processor 62*b* can be omitted from the second signal processing unit 54*b*, and the second AD converter 54Bb can be electrically connected to the second signal output 56*b*. In a case where the second processor 62*b* is omitted, the second AD converter 54Bb is electrically connected to the second signal output 56*b*.

The wireless transmission device 60 can be provided on each of the first crank arm 24X and the second crank arm 24Y. In this case, the wireless transmission device 60 provided on the first crank arm 24X is configured to transmit information corresponding to a signal from the first signal processing unit 54*a* through wireless connection, and the wireless transmission device 60 provided on the second crank arm 24Y is configured to transmit information corresponding to a signal from the second signal processing unit 54*b* through wireless connection. The information corresponding to a signal from the first signal processing unit 54*a* includes, for example, at least one of information on force applied to the first crank arm 24X, information related to power applied to the first crank arm 24X, in relation to the rotational center of the crank axle 26, information on force acting in a radial direction of the first crank arm 24X, information on force acting in the rotational direction of the first crank arm 24X, and information on force acting in a direction of skew relative to a longitudinal axis of the first crank arm 24X. The information corresponding to a signal from the second signal processing unit 54*b* includes, for example, at least one of information on force applied to the second crank arm 24Y, information related to power applied to the second crank arm 24Y, in relation to the rotational center of the crank axle 26, information on force acting in a radial direction of the second crank arm 24Y, information on force acting in the rotational direction of the second crank arm 24Y, and information on force acting in a direction of skew relative to a longitudinal axis of the second crank arm 24Y.

In a case where the first processor 62*a* receives information from the second signal processing unit 54*b*, the first processor 62*a* can be configured to output synthesized information, which is obtained by combining information calculated by the first processor 62*a* and information transmitted from the second signal processing unit 54*b*, from the first signal output 56*a*. The synthesized information includes, for example, information related to power applied to the first crank arm 24X and the second crank arm 24Y. The first processor 62*a* can be configured to output the information calculated by the first processor 62*a* and the information transmitted from the second processor 62*b* separately from the first signal output 56*a*.

In the present embodiment, the first signal processing unit 54*a* and the second signal processing unit 54*b* are supplied with electric power from the same power supply 63. The power supply 63 is electrically connected to the first electric power input 58*a* and to the second electric power input 58*b* by the electric cable 63*a*. The power supply 63 can be provided on each of the first crank arm 24X and the second crank arm 24Y.

Preferably, the component 20 further includes an operating portion 64 provided on the component body 22 to input a reset signal to the processor 62. The operating portion 64 includes, for example, a switch. The operating portion 64 is arranged at a position operable by a user. In the present embodiment, the operating portion 64 is arranged on the case 25. Alternatively, the operating portion 64 can be arranged on the cover 50. In a case where a first operation is performed on the operating portion 64, for example, the processor 62 deletes or initializes part of information stored in the storage. The information stored in the storage can be, for example, a value calculated by the processor 62 in accordance with the output of the strain gauge 52, a correction value used in a case where the processor 62 performs calculation using the output of the strain gauge 52, or information related to the wireless transmission device 60.

Preferably, the component 20 further includes a rotational state detector 66 that detects a rotational state of at least part of the component body 22. In the present embodiment, the rotational state detector 66 detects information corresponding to a rotational speed of the crank axle 26. The rotational state detector 66 includes, for example, a magnetic sensor. The magnetic sensor detects, for example, a magnetic force of a magnet M provided on the frame 30. The magnetic sensor includes, for example, a reed switch including a magnetic reed. The terms "detector" and "sensor" as used herein refers to a hardware device or instrument designed to detect the presence or absence of a particular event, object, substance, or a change in its environment, and to emit a signal in response. The terms "detector" and "sensor" as used herein do not include a human. The distance between the magnetic sensor and the magnet M is changed by the rotation of the component body 22. Thus, the magnetic sensor outputs a signal in accordance with the rotational speed of the component body 22. Preferably, the rotational state detector 66 is electrically connected to the processor 62. Preferably, a signal output from the rotational state detector 66 is input to the processor 62. The rotational state detector 66 can be included in the signal processing unit 54. In the present embodiment, the rotational state detector 66 is provided on only the first crank arm 24X. The rotational state detector 66 can be provided on both the first crank arm 24X and the second crank arm 24Y. Alternatively, the rotational state detector 66 can be provided on only the second crank arm 24Y or the crank axle 26.

Preferably, the component 20 further includes a notification device 68 provided on the component body 22. The notification device 68 includes at least one of a light generation device 68A and a sound generation device. The light generation device 68A includes, for example, a light emitting diode (LED). The light generation device 68A is provided on the component body 22 at a position where it is visible to a user. In the present embodiment, the notification device 68 is arranged, for example, on the case 25. Alternatively, the notification device 68 can be arranged on the cover 50. The sound generation device includes, for example, a speaker. For example, the processor 62 can control the notification device 68 so that the notification device 68 issues notification in accordance with information processed by the processor 62. For example, the processor 62 can control the notification device 68 so that the notification device 68 issues notification in accordance with information related to a battery level of the power supply 63. The notification device 68 can be provided on each of the first crank arm 24X and the second crank arm 24Y. Preferably, the wireless transmission device 60, the notification device 68, and the operating portion 64 are supplied with the electric power of the power supply 63.

Figure 9:
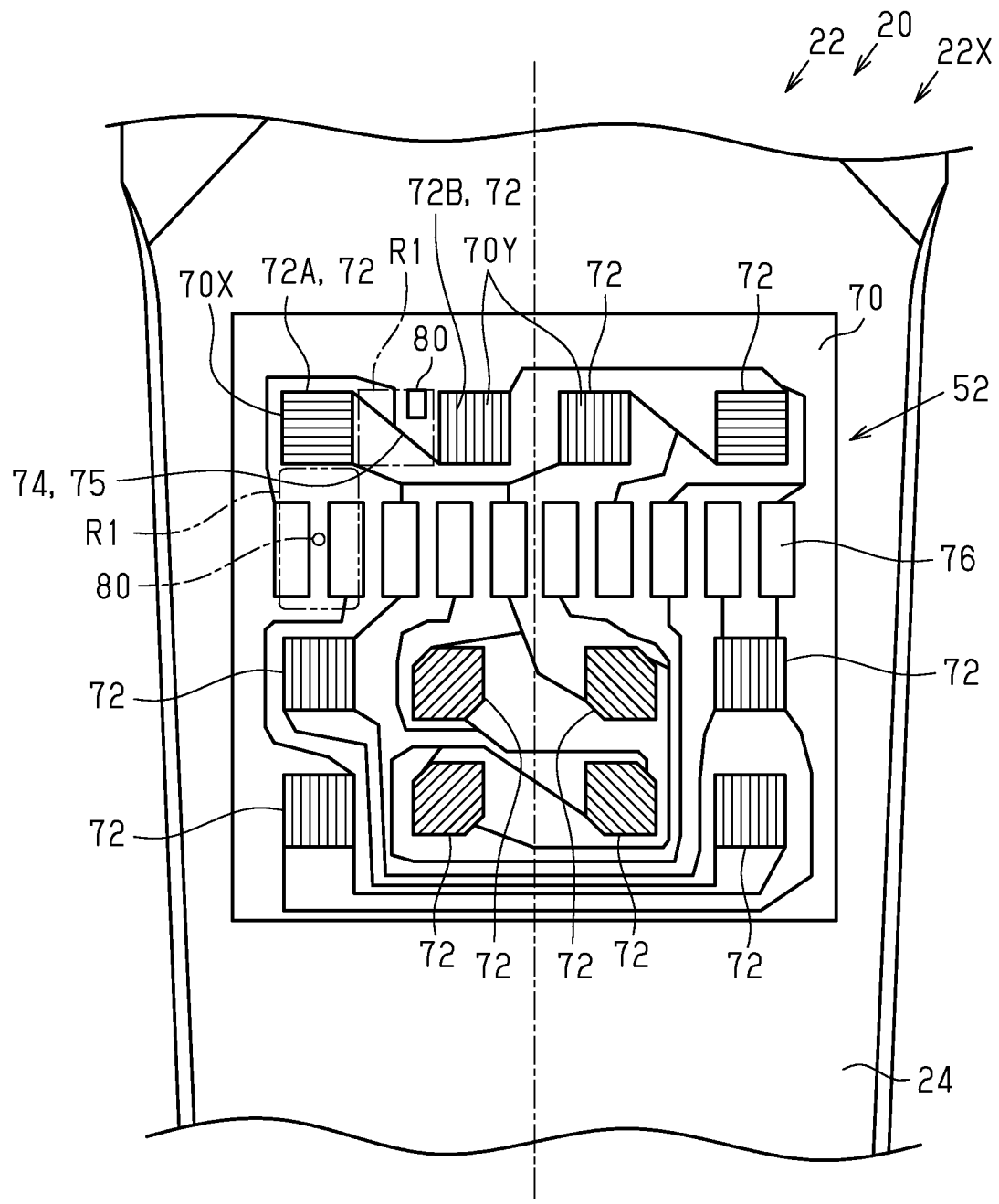
FIG. 9 is a schematic diagram showing one example of the configuration of a strain gauge shown in FIG. 4.

As shown in FIG. 9, the strain gauge 52 includes the substrate 70 and a resistor provided on the substrate 70. Preferably, the resistor 72 includes more than one resistor 72. Preferably, at least some of the resistors 72 are electrically connected. Preferably, some of the resistors 72 detect strain in a certain direction, and the rest of the resistors 72 detect strain in a different direction. In a case where the strain gauge 52 is provided on the crank arm 24, the strain gauge 52 is arranged on the crank arm 24 so that, in relation to the rotational center of the crank axle 26, the strain gauge 52 outputs a signal corresponding to at least one of force acting in the radial direction of the crank arm 24, force acting in the rotational direction of the crank arm 24, and force acting in the direction of skew related to the longitudinal axis of the crank arm 24. In FIG. 9, twelve resistors 72 are provided on the substrate 70 to form twelve strain gauges 52. The number and the layout pattern of the resistors 72 are not limited and can be changed in correspondence with a measurement subject.

Preferably, the strain gauge 52 includes a gauge wire 74 provided on the substrate 70 and electrically connected to the resistor 72. Preferably, the resistor 72 includes a first resistor 72A and a second resistor 72B. The gauge wire 74 electrically connects the first resistor 72A and the second resistor 72B. In a case where the resistor 72 includes three or more resistors 72, the first resistor 72A is one of the three or more resistors 72, and the second resistor 72B is one of the three or more resistors 72 differing from the first resistor 72A. Preferably, at least some of the resistors 72 form a bridge circuit. The bridge circuit can be a half-bridge circuit or a full-bridge circuit. The substrate 70 includes an insulative and flexible resin film. Preferably, the resin film is a polyimide film.

Preferably, the strain gauge 52 further includes a gauge terminal 76 provided on the substrate 70 and electrically connected to the resistor 72. The gauge wire 74 electrically connects the resistor 72 and the gauge terminal 76. The gauge terminal 76 is, for example, a pad.

The component 20 includes the component body 22, a single substrate 70 provided on the component body 22, the resistor 72 formed on the substrate 70 and forming the strain gauge 52 with part of the substrate 70, an electric wire 75, the signal processing unit 54, the signal output 56, and the electric power input 58. The electric wire 75 is formed on the substrate 70, and electrically connected to the resistor 72. The signal processing unit 54 can be formed or directly mounted on the substrate 70 and electrically connected to the electric wire 75. In a case where the signal processing unit 54 is formed or directly mounted on the substrate 70, the gauge terminal 76 can be omitted. Preferably, the component 20 further includes a temperature sensor 80 formed or mounted on the substrate 70.

As shown in FIGS. 5 to 8, the strain gauge 52, at least part of the signal processing unit 54, and the electric power input 58 can be included in a single module 59. Preferably, at least part of the signal output 56 is included in the module 59. In a case where the signal output 56 includes the wireless transmission device 60, the wireless transmission device 60 can be included in the module 59 but does not have to be included in the module 59. The wireless transmission device 60 can be directly mounted on the substrate 70. The wireless transmission device 60 includes a signal processing circuit and can further include an antenna.

Figure 5:
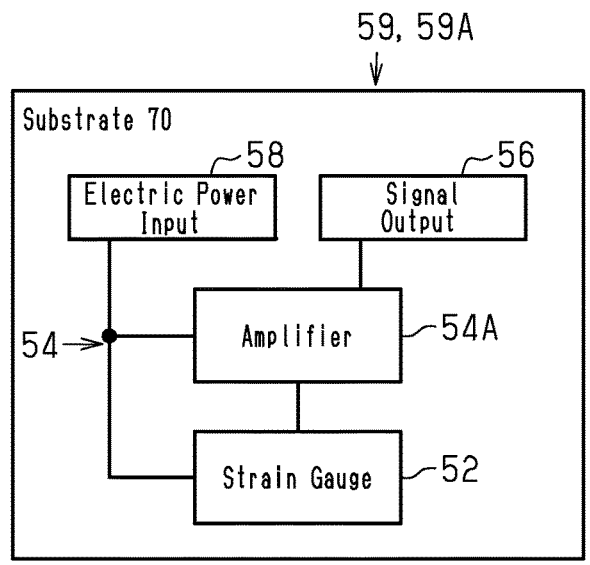
FIG. 5 is a block diagram showing a first example of a module.

In a module 59A shown in FIG. 5, the strain gauge 52 is formed on the substrate 70, and the amplifier 54A is directly mounted on the substrate 70. In the module 59A, the electric power input 58 is formed or mounted on the substrate 70, and the signal output 56 is formed or mounted on the substrate 70. The AD converter 54B is not mounted on the substrate 70. The AD converter 54B can be, for example, provided on a flexible printed wiring board electrically connected to the substrate 70, or provided on an electric circuit board electrically connected to the substrate 70 by a flexible printed wiring board. The processor 62 is not mounted on the substrate 70. The processor 62 can be provided on a flexible printed wiring board electrically connected to the substrate 70, or provided on an electric circuit board electrically connected to the substrate 70 by a flexible printed wiring board.

Figure 6:
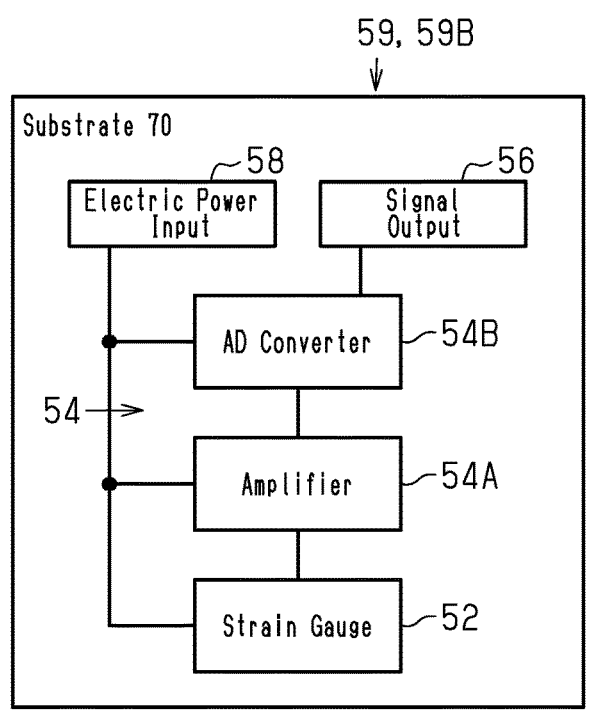
FIG. 6 is a block diagram showing a second example of the module.

In a module 59B shown in FIG. 6, the strain gauge 52 is formed on the substrate 70. Further, the amplifier 54A and the AD converter 54B are directly mounted on the substrate 70. In the module 59B, the electric power input 58 is formed or mounted on the substrate 70, and the signal output 56 is formed or mounted on the substrate 70. The processor 62 is not mounted on the substrate 70. The processor 62 can be provided on a flexible printed wiring board electrically connected to the substrate 70, or provided on an electronic circuit board electrically connected to the substrate 70 by a flexible printed wiring board.

Figure 7:
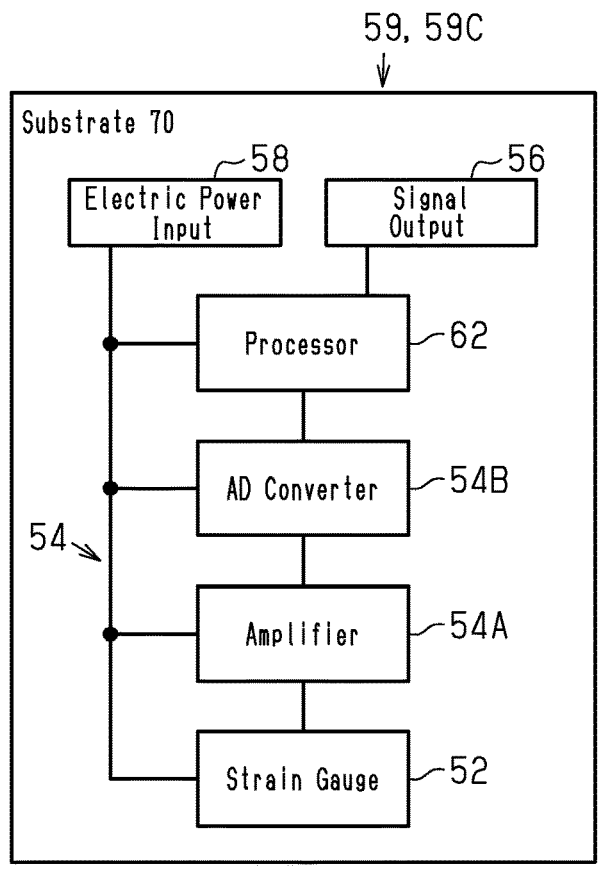
FIG. 7 is a block diagram showing a third example of the module.

In a module 59C shown in FIG. 7, the strain gauge 52 is formed on the substrate 70. Further, the amplifier 54A, the AD converter 54B, and the processor 62 are directly mounted on the substrate 70. In the module 59C, the electric power input 58 is formed or mounted on the substrate 70, and the signal output 56 is formed or mounted on the substrate 70. In the module 59C, the signal output 56 can include the wireless transmission device 60.

Figure 8:
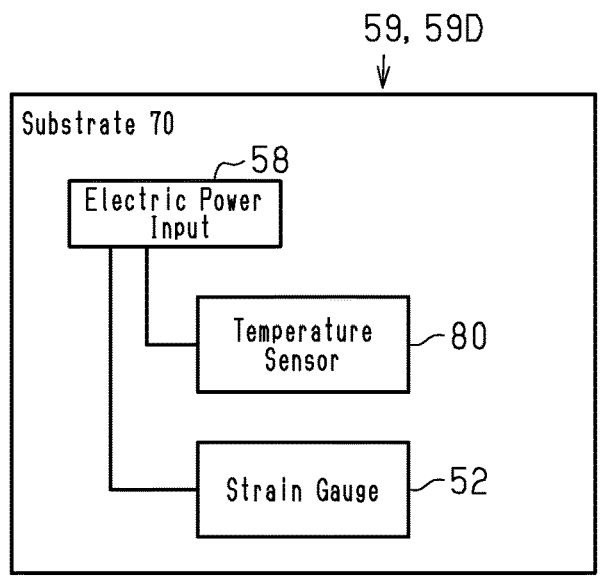
FIG. 8 is a block diagram showing a fourth example of the module.

As shown in FIG. 8, the strain gauge 52, the electric power input 58, and the temperature sensor 80 can be included in the single module 59. In a module 59D shown in FIG. 8, the strain gauge 52 is formed on the substrate 70, and the temperature sensor 80 is formed or mounted on the substrate 70. In the module 59D, the electric power input 58 is formed or mounted on the substrate 70. In the modules 59A, 59B, and 59C, the temperature sensor 80 can be formed or mounted on the substrate 70. In the module 59A, the amplifier 54A can be changed to the AD converter 54B. FIGS. 5 to 8 show examples of the module 59.

At least part of the substrate 70 is adhered to the component body 22 by an adhesive. At least a portion of the substrate 70 that forms the strain gauge 52 is adhered to the component body 22 by the adhesive. In the present embodiment, at least the portion of the substrate 70 that forms the strain gauge 52 is adhered to, for example, the crank arm 24 on a surface faced toward an imaginary center plane of the human-powered vehicle 10 in a sideward direction. At least the portion of the substrate 70 that forms the strain gauge 52 can be adhered to, for example, the crank arm 24 on a surface located in at least one of an upstream side or a downstream side in the rotational direction. In a case where the crank arm 24 is hollow, at least the portion of the substrate 70 that forms the strain gauge 52 can be adhered to, for example, an inner surface of the crank arm 24.

The sealed space 22A is defined by the outer surface of the corresponding one of the two crank arms 24 and the corresponding cover 50. The cover 50 is arranged to cover the module 59 provided on the crank arm 24. Preferably, at least part of the module 59 is disposed in the sealed space 22A. Preferably, the entire module 59 is arranged in the sealed space 22A. The sealed space 22A does not have to be completely sealed and can be, for example, connected to the inside of the crank arm 24.

The module 59 provided on the first crank arm 24X and the module 59 provided on the second crank arm 24Y can have different configurations. The module 59B can be provided on the first crank arm 24X, and the module 59C can be provided on the second crank arm 24Y.

The temperature sensor 80 includes at least one of a thermocouple, a thermistor, a resistance thermometer, and a linear resistor. Preferably, in accordance with the output of the temperature sensor 80, the processor 62 corrects at least one of a signal output from the strain gauge 52 and information related to a signal output from the strain gauge 52. Preferably, a signal output from the temperature sensor 80 is converted into a digital signal by the AD converter and then input to the processor 62.

Preferably, the temperature sensor 80 is arranged on the component 20 in accordance with at least one of a first layout example A1, a second layout example A2, a third layout example A3, and a fourth layout example A4, which will be described below. The temperature sensor 80 can include more than one temperature sensor 80. In a case where the temperature sensor 80 includes more than one temperature sensor 80, the temperature sensors 80 can be arranged on the component 20 at different positions as in the first to fourth layout examples A1 to A4.

As shown in FIG. 9, in the first layout example A1, the resistor 72 includes the first resistor 72A and the second resistor 72B, and at least part of the temperature sensor 80 is located on the substrate 70 in a region R1 between the first resistor 72A and the second resistor 72B.

Figure 10:
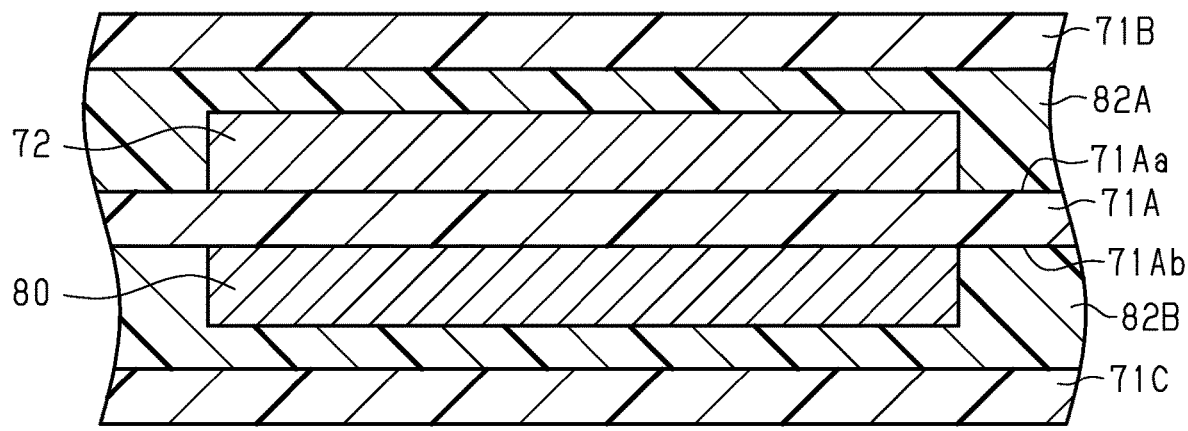
FIG. 10 is a cross-sectional view showing a first example of the positional relationship between the strain gauge shown in FIG. 4 and a temperature sensor.
Figure 11:
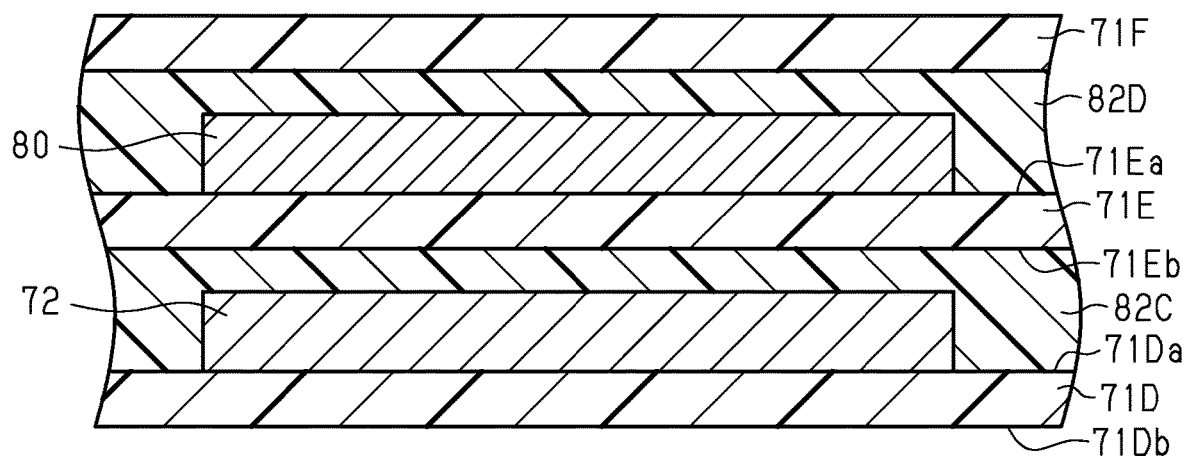
FIG. 11 is a cross-sectional view showing a second example of the positional relationship between the strain gauge shown in FIG. 4 and the temperature sensor.

As shown in FIGS. 10 and 11, in the second layout example A2, as viewed in a thickness direction of the substrate 70, at least part of the temperature sensor 80 is arranged to overlap at least part of the resistor 72.

In the second layout example A2 shown in FIG. 10, the substrate 70 includes a first layer 71A. The first layer 71A includes a first setting surface 71Aa and a second setting surface 71Ab that are spaced apart in the thickness direction. The resistor 72 is arranged on the first setting surface 71Aa, and the temperature sensor 80 is arranged on the second setting surface 71Ab. In the second layout example A2 shown in FIG. 10, it is preferred that the substrate 70 include a second layer 71B and a third layer 71C. The second layer 71B is arranged on the first setting surface 71Aa of the first layer 71A to cover the resistor 72 with an adhesive layer 82A in between. The third layer 71C is arranged on the second setting surface 71Ab of the first layer 71A to cover the temperature sensor 80 with an adhesive layer 82B in between. Preferably, the first layer 71A, the second layer 71B, and the third layer 71C each include an insulative and flexible resin film. Preferably, the resin film is a polyimide film. The adhesive layer 82A and the adhesive layer 82B each include, for example, epoxy resin. The substrate 70 can include the adhesive layer 82A and the adhesive layer 82B. In the second layout example A2 shown in FIG. 10, the second layer 71B can be adhered to the component body 22, and the third layer 71C can be adhered to the component body 22.

In the second layout example A2 shown in FIG. 11, the substrate 70 includes a first layer 71D and a second layer 71E. The first layer 71D includes a first setting surface 71Da and a second setting surface 71Db that are spaced apart in the thickness direction of the first layer 71D. The resistor 72 is arranged on the first setting surface 71Da, and the second layer 71E is arranged on the first setting surface 71Da of the first layer 71D to cover the resistor 72 with an adhesive layer 82C in between. The second layer 71E includes a first setting surface 71Ea and a second setting surface 71Eb that are spaced apart in the thickness direction of the second layer 71E. The second setting surface 71Eb of the second layer 71E is faced toward the first setting surface 71Da of the first layer 71D. The temperature sensor 80 is arranged on the first setting surface 71Ea of the second layer 71E. In the second layout example A2 shown in FIG. 11, it is preferred that the substrate 70 include a third layer 71F. The third layer 71F is arranged on the first setting surface 71Ea of the second layer 71E to cover the temperature sensor 80 with an adhesive layer 82D in between. In the second layout example A2 shown in FIG. 11, it is preferred that the first layer 71D be adhered to the component body 22. In the second layout example A2 shown in FIG. 11, the temperature sensor 80 can be arranged on the first layer 71D, and the resistor 72 can be arranged on the second layer 71E. Preferably, the first layer 71D, the second layer 71E, and the third layer 71F each include an insulative and flexible resin film. Preferably, the resin film is a polyimide film. The adhesive layer 82C and the adhesive layer 82D each include, for example, epoxy resin. The substrate 70 can include the adhesive layer 82C and the adhesive layer 82D.

In a case where at least part of the signal processing unit 54 is not formed or mounted on the substrate 70 or in a case where the processor 62 is not mounted on the substrate 70, the component 20 can include an electric circuit board 84 and a flexible printed wiring board 86, which electrically connects the strain gauge 52 and the electric circuit board 84. In the third layout example A3 shown in FIGS. 12 and 13, the substrate 70 of the strain gauge 52 is formed separately from the flexible printed wiring board 86 and the electric circuit board 84. Preferably, the substrates 70 of the flexible printed wiring board 86 includes an insulative and flexible resin film. Preferably, the resin film is a polyimide film. The electric circuit board 84 includes a typical printed wiring board. An electronic component 84A is provided on the electric circuit board 84. The electronic component 84A includes at least one of, for example, at least part of the signal processing unit 54, the processor 62, the electric power input 58, and the signal output 56. An electronic component 86A can be provided on the flexible printed wiring board 86. The electronic component 86A can include, for example, at least part of the signal processing unit 54. An electric wire 78A is formed on the flexible printed wiring board 86. The electric wire 78A is formed so that, for example, only two ends in an electric power transmission direction are exposed to the outside from the flexible printed wiring board 86.

Figure 15:
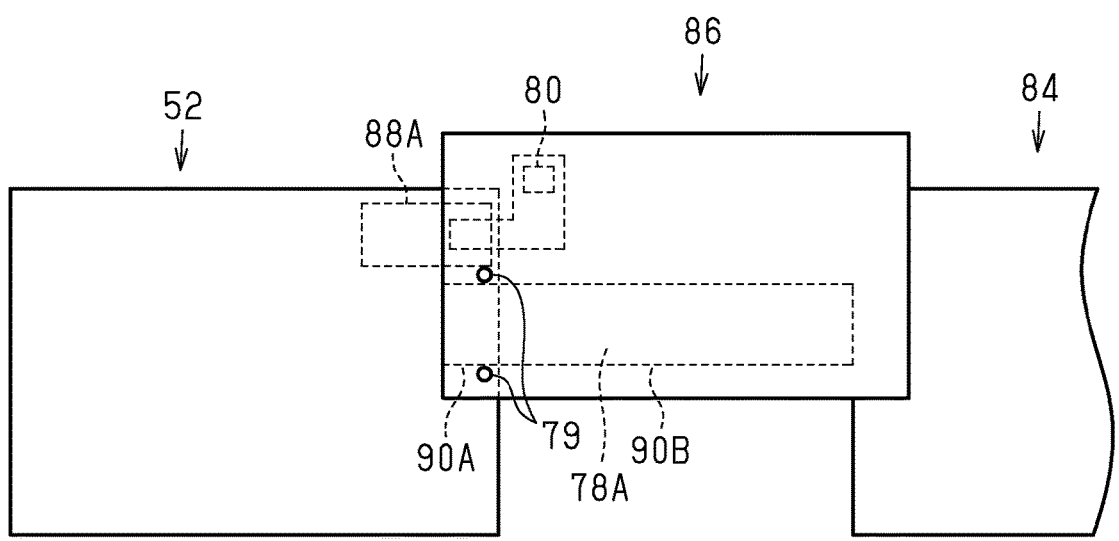
FIG. 15 is a plan view showing the positional relationship of the strain gauge and the temperature sensor in the fifth example shown in FIG. 14.

As shown in FIG. 15, for example, the component 20 can further include a fastener 79. The fastener 79 couples the strain gauge 52 and the flexible printed wiring board 86 so that the gauge terminal 76 and the electric wire 78A are in close contact. The fastener 79 includes, for example, at least one of a screw, a bolt, and a clamp. The fastener 79 is arranged, for example, at two sides of the gauge terminal 76 in a predetermined direction. The fastener 79 can be configured, for example, to fasten a plate-like member to the component body 22 in a state in which the gauge terminal 76 and part of the electric wire 78A are sandwiched between the plate-like member and the component body 22.

The temperature sensor 80 can be provided on at least one of the flexible printed wiring board 86, a first connecting portion 88A connecting the strain gauge 52 and the flexible printed wiring board 86, and a second connecting portion 88B connecting the flexible printed wiring board 86 and the electric circuit board 84. The first connecting portion 88A and the second connecting portion 88B include, for example, solder or an anisotropic conductive film (ACF) connection structure.

Figure 12:
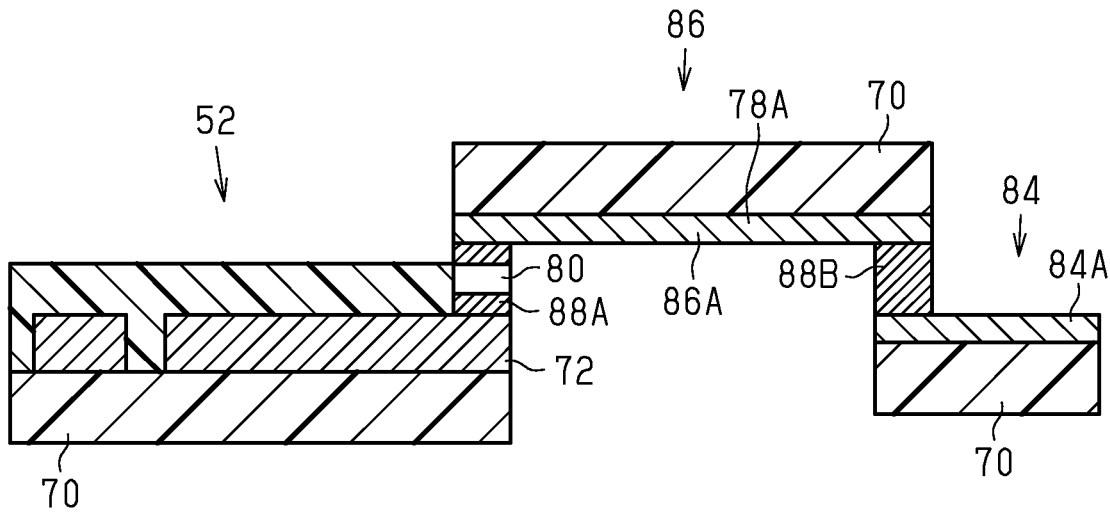
FIG. 12 is a cross-sectional view showing a third example of the positional relationship between the strain gauge shown in FIG. 4 and the temperature sensor.

In the third layout example A3 shown in FIG. 12, the temperature sensor 80 is provided on the first connecting portion 88A. The first connecting portion 88A includes, for example, solder. The first connecting portion 88A electrically connects the resistor 72 of the strain gauge 52 and the electric wire 78A provided on the flexible printed wiring board 86. The first connecting portion 88A is located between the gauge terminal 76 and the electric wire 78A. In the third layout example A3 shown in FIG. 12, the temperature sensor 80 is provided at a position closer to the resistor 72 than the electric circuit board 84. In the first connecting portion 88A, the temperature sensor 80 can be mounted on the substrate 70 of the strain gauge 52 or on the flexible printed wiring board 86. In the first connecting portion 88A, the temperature sensor 80 can be connected by solder to the gauge terminal 76 and to the electric wire 78A.

Figure 13:
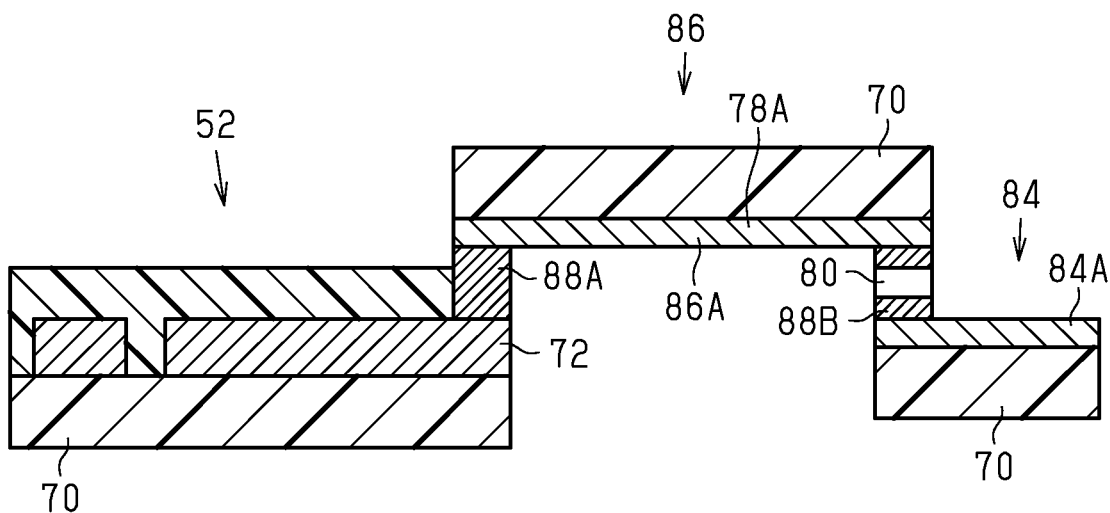
FIG. 13 is a cross-sectional view showing a fourth example of the positional relationship between the strain gauge shown in FIG. 4 and the temperature sensor.

In the third layout example A3 shown in FIG. 13, the temperature sensor 80 is provided on the second connecting portion 88B. The second connecting portion 88B includes, for example, solder. The second connecting portion 88B electrically connects the electronic component 84A provided on the electric circuit board 84 and the electric wire 78A provided on the flexible printed wiring board 86. The second connecting portion 88B is located between the electric wire 78A and a terminal of the electric circuit board 84, which is connected to the electric wire 78A. In the layout example A3 shown in FIG. 13, the temperature sensor 80 is provided at a position closer to the flexible printed wiring board 86 than the resistor 72. In the second connecting portion 88B, the temperature sensor 80 can be mounted on the electric circuit board 84 or on the flexible printed wiring board 86. In the second connecting portion 88B, the temperature sensor 80 can be connected by solder to the electric wire 78A and to a terminal of the electric circuit board 84, which is connected to the electric wire 78A.

Figure 14:
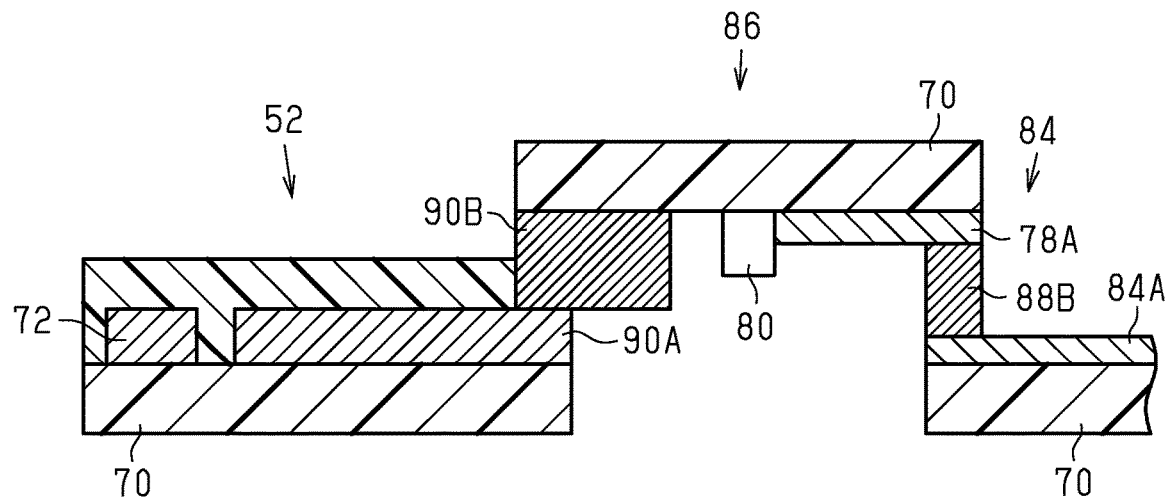
FIG. 14 is a cross-sectional view showing a fifth example of the positional relationship between the strain gauge shown in FIG. 4 and the temperature sensor.

In the fourth layout example A4 shown in FIGS. 14 and 15, the temperature sensor 80 is provided on the flexible printed wiring board 86. The temperature sensor 80 can be provided on the flexible printed wiring board 86. The strain gauge 52 can include the resistor 72 and a first thermal conductor 90A electrically insulated from the resistor 72. The flexible printed wiring board 86 can include a second thermal conductor 90B connected to the first thermal conductor 90A. The temperature sensor 80 can be in contact with or in the proximity of the second thermal conductor 90B. Preferably, the first thermal conductor 90A and the second thermal conductor 90B can have a higher thermal conductivity than the substrate 70. For example, the first thermal conductor 90A and the second thermal conductor 90B are formed from a metal material. The first thermal conductor 90A and the second thermal conductor 90B include, for example, Cu. The first thermal conductor 90A can be connected to the second thermal conductor 90B indirectly by solder or an anisotropic conductive film (ACF). In a case where the first thermal conductor 90A is indirectly connected to the second thermal conductor 90B, the processor 62 can be configured to correct the detected temperature in correspondence with the member that connects the first thermal conductor 90A and the second thermal conductor 90B. As viewed in the thickness direction of the substrate 70, the temperature sensor 80 can be, for example, arranged to overlap the second thermal conductor 90B. The temperature sensor 80 can be formed integrally with the second thermal conductor 90B. A signal output from the temperature sensor 80 is transmitted, for example, through the electric wire 78A.

At least one of the amplifier 54A and the AD converter 54B can be electrically connected to the strain gauge 52 and provided on at least one of the flexible printed wiring board 86, the first connecting portion 88A, and the second connecting portion 88B. In a fifth layout example B1 shown in FIG. 16 and a sixth layout example B2 shown in FIG. 17, the component 20 includes the electric circuit board 84 and the flexible printed wiring board 86 that electrically connects the strain gauge 52 and the electric circuit board 84. In the fifth layout example B1 shown in FIG. 16, the substrate 70 of the strain gauge 52 is formed separately from the flexible printed wiring board 86 and the electric circuit board 84. In the sixth layout example B2 shown in FIG. 17, the substrate 70 of the electric circuit board 84 is formed separately from the flexible printed wiring board 86 and the electric circuit board 84.

At least one of the amplifier 54A and the AD converter 54B can be provided on at least one of the flexible printed wiring board 86, the first connecting portion 88A connecting the strain gauge 52 and the flexible printed wiring board 86, and the second connecting portion 88B connecting the flexible printed wiring board 86 and the electric circuit board 84. At least one of the amplifier 54A and the AD converter 54B can be arranged on the flexible printed wiring board 86. Among the amplifier 54A and the AD converter 54B, only the amplifier 54A can be arranged on the flexible printed wiring board 86. Among the amplifier 54A and the AD converter 54B, only the AD converter 54B can be arranged on the flexible printed wiring board 86. At least one of the amplifier 54A and the AD converter 54B can be arranged on the component 20 in accordance with at least one of the fifth layout example B1 and the sixth layout example B2. The amplifier 54A and the AD converter 54B can be arranged on the component 20 at different positions as in the fifth layout example B1 and the sixth layout example B2, respectively.

Figure 16:
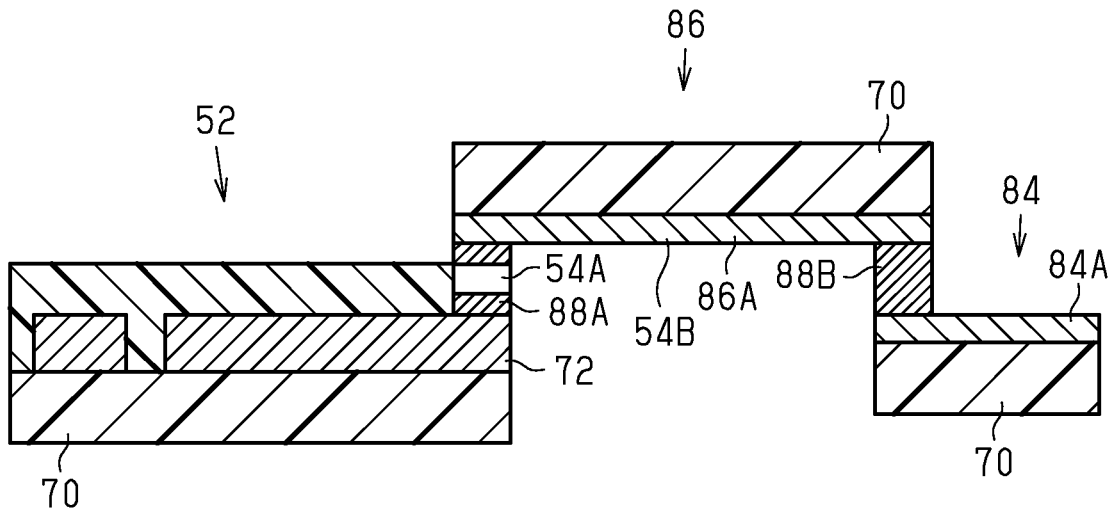
FIG. 16 is a cross-sectional view showing a first example of the positional relationship between the strain gauge and an amplifier shown in FIG. 4.
Figure 17:
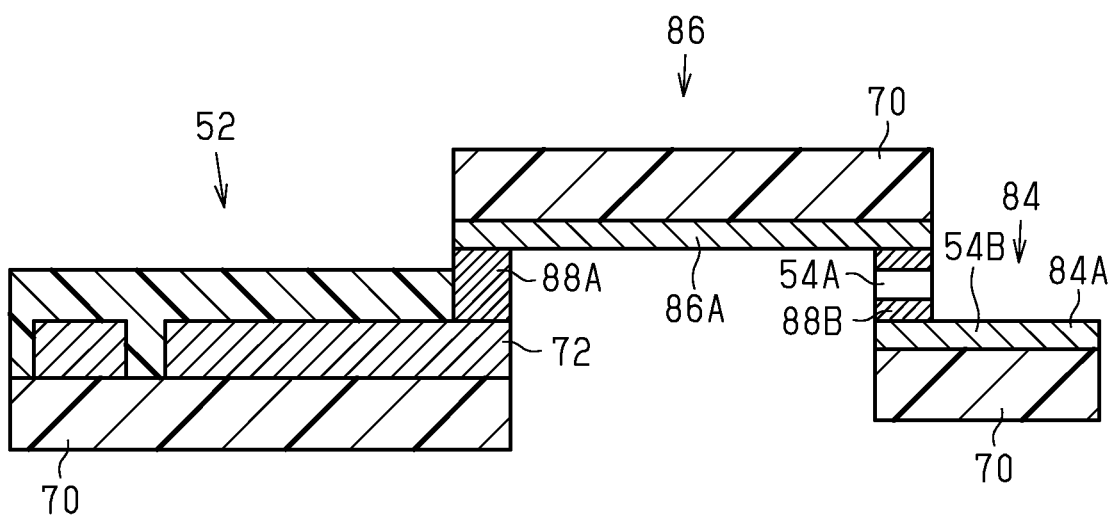
FIG. 17 is a cross-sectional view showing a second example of the positional relationship between the strain gauge and the amplifier shown in FIG. 4.

In the fifth layout example B1 shown in FIG. 16, at least one of the amplifier 54A and the AD converter 54B is provided on the first connecting portion 88A. In the first connecting portion 88A, at least one of the amplifier 54A and the AD converter 54B can be mounted on the substrate 70 of the strain gauge 52 or on the flexible printed wiring board 86. In the first connecting portion 88A, at least one of the amplifier 54A and the AD converter 54B can be connected by solder to the gauge terminal 76 and to the electric wire 78A. In the sixth layout example B2 shown in FIG. 17, at least one of the amplifier 54A and the AD converter 54B is provided on the second connecting portion 88B. In the second connecting portion 88B, at least one of the amplifier 54A and the AD converter 54B can be mounted on the electric circuit board 84 or on the flexible printed wiring board 86. In the second connecting portion 88B, at least one of the amplifier 54A and the AD converter 54B can be connected by solder to the electric wire 78A and to a terminal of the electric circuit board 84, which is connected to the electric wire 78A.

Preferably, the resistor 72 is formed by a metal layer having a thickness of 0.01 micrometers or greater and 1 micrometer or less. Preferably, the thickness of the metal layer is 0.05 micrometers or greater and 0.5 micrometers or less. Preferably, the thickness of the metal layer is 0.1 micrometers or greater and 0.3 micrometers or less. The resistor 72 has a line width and a line interval that are selected in correspondence with the size of the strain gauge 52. The line width of the resistor 72 is, for example, 1 micrometer or greater and 200 micrometers or less. The line interval of the resistor 72 is, for example, 1 micrometer or greater and 200 micrometers or less.

Preferably, the gauge wire 74 has a lower electrical resistance per unit length than the resistor 72. The electric wire 75 has a lower electrical resistance per unit length than the resistor 72. In the present embodiment, the electric wire 75 is equivalent to the gauge wire 74. Accordingly, in the description hereafter, the gauge wire 74 can be read as the electric wire 75, and the electric wire 75 can be read as the gauge wire 74.

In accordance with the configuration of at least one of a first example and a second example, which will be described below, the electrical resistance per unit length of the gauge wire 74 and the electric wire 75 can be lower than that of the resistor 72. The thickness of the resistor 72 and the gauge wire 74 can be equal or different.

Figure 18:
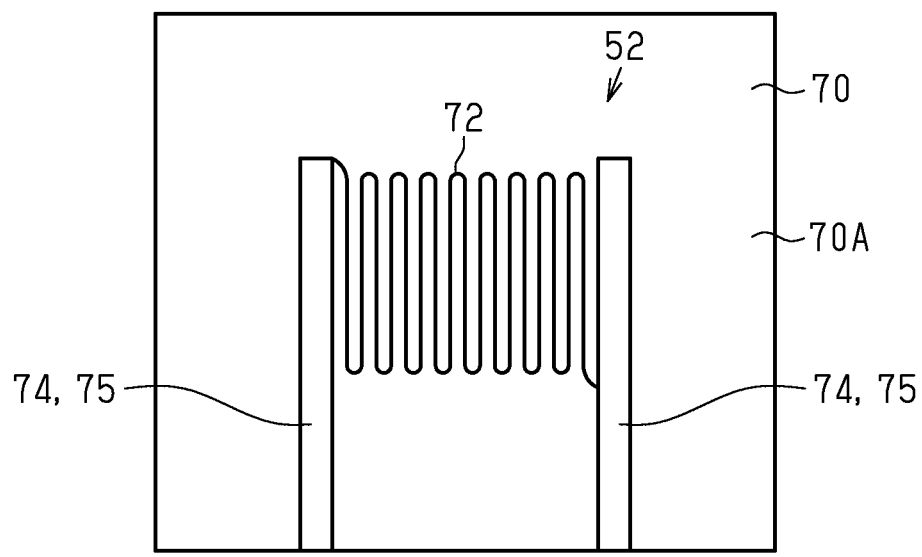
FIG. 18 is a schematic diagram showing a first example of the structure of a resistor and a gauge wire in the strain gauge shown in FIG. 4.

FIG. 18 shows the configuration of the first example. In the configuration of the first example, the resistor 72 and the gauge wire 74 have different compositions. The resistor 72 and the electric wire 75 have different compositions. Preferably, the resistor 72 includes one of CuNi, Ni, and NiCr, and at least part of the gauge wire 74 includes Cu. Preferably, the resistor 72 includes one of CuNi, Ni, and NiCr, and at least part of the electric wire 75 includes Cu.

Figure 19:
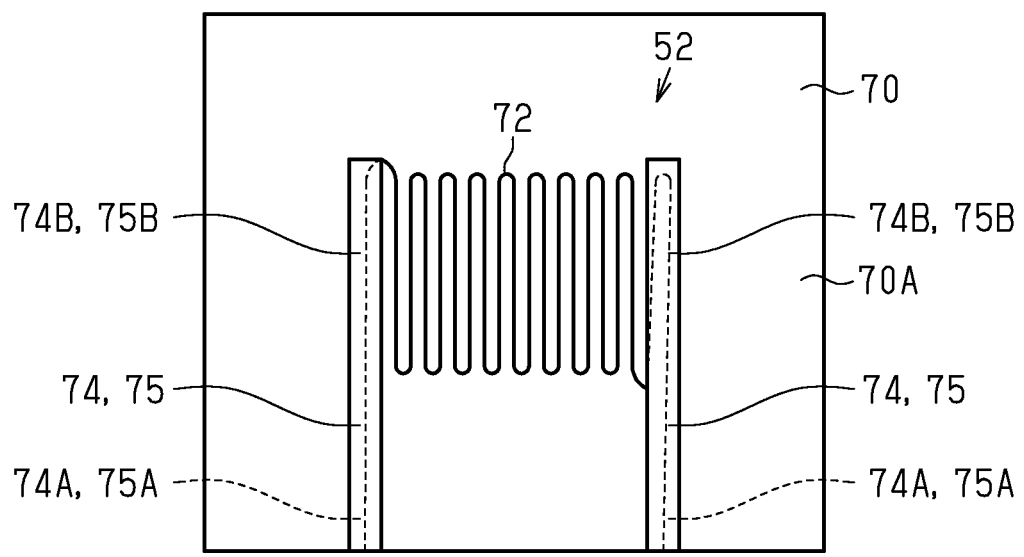
FIG. 19 is a schematic diagram showing a second example of the structure of the resistor and the gauge wire in the strain gauge shown in FIG. 4.
Figure 20:
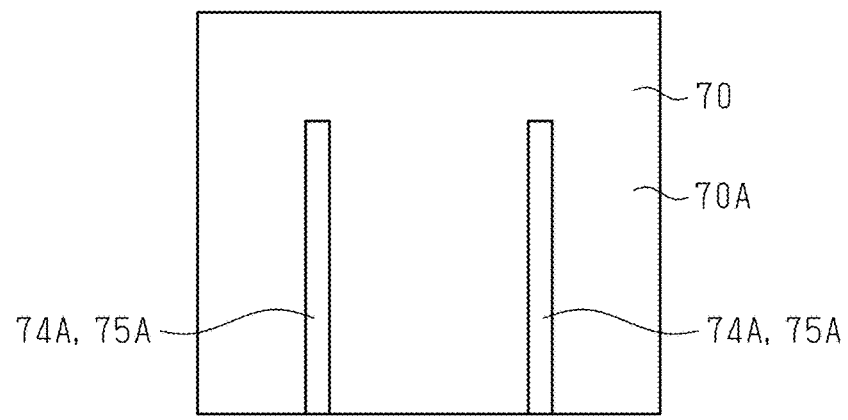
FIG. 20 is a schematic diagram illustrating a first step of a method for manufacturing the resistor and the gauge wire shown in FIG. 19.

FIG. 19 shows the configuration of the second example. In the configuration of the second example, the gauge wire 74 includes a first portion 74A and a second portion 74B that covers the first portion 74A, the resistor 72 is molded integrally with the first portion 74A of the gauge wire 74, and the second portion 74B has a lower electrical resistivity than the resistor 72 and the first portion 74A. The electric wire 75 includes a first wire portion 75A and a second wire portion 75B that covers the first wire portion 75A, the resistor 72 is molded integrally with the first wire portion 75A of the electric wire 75, and the second wire portion 75B has a lower electrical resistivity than the resistor 72 and the first wire portion 75A. Preferably, the resistor 72, the first portion 74A, and the first wire portion 75A include one of CuNi, Ni, and NiCr, and the second portion 74B and the second wire portion 75B can include Cu.

A method for manufacturing the resistor 72 and the gauge wire 74 shown in FIG. 18 will now be described with reference to FIGS. 18 and 20 to 22. In a first step shown in FIG. 20, the gauge wire 74 is formed on a first setting surface 70A of the substrate 70. The gauge wire 74 is formed, for example, by sputtering.

Figure 21:
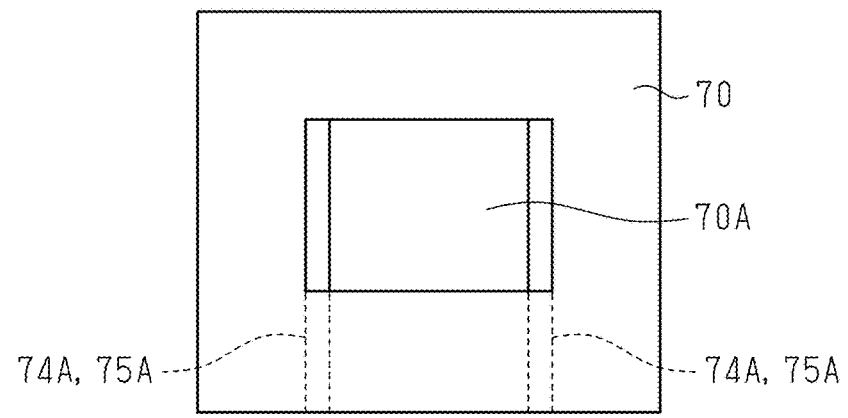
FIG. 21 is a schematic diagram illustrating a second step of the method for manufacturing the resistor and the gauge wire shown in FIG. 19.

In a second step shown in FIG. 21, a resist that covers the gauge wire 74 is formed on the first setting surface 70A of the substrate 70, and an opening is formed in the resist in a region where the resistor 72 is formed. The opening is formed through, for example, exposure, developing, and etching. The resist is formed from, for example, a photoresist.

Figure 22:
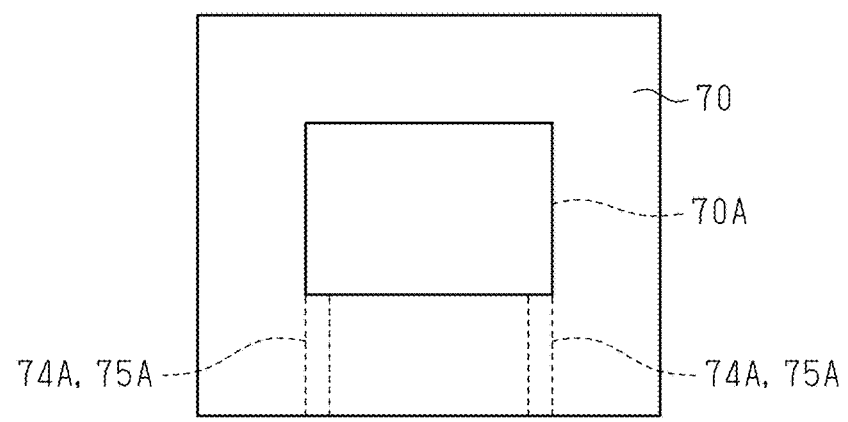
FIG. 22 is a schematic diagram illustrating a third step of the method for manufacturing the resistor and the gauge wire shown in FIG. 19.

In a third step shown in FIG. 22, a metal film for the resistor 72 is formed in the opening formed in the second step. The metal film is formed by, for example, sputtering. In a fourth step, a resist is formed on the metal film formed in the third step, and the resistor 72 is formed through, for example, exposure, developing, and etching. After the fourth step, the resist is removed in a fifth step to connect the resistor 72 and the gauge wire 74. The first to fifth steps can be performed in a roll-to-roll (RTR) processing method.

Figure 23:
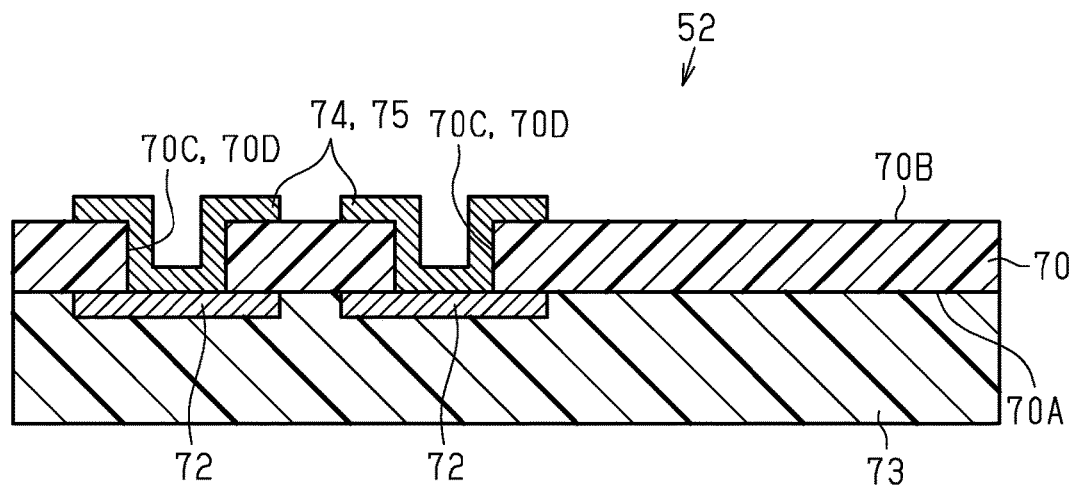
FIG. 23 is a cross-sectional view showing one example of a method for connecting the strain gauge and the gauge wire shown in FIG. 4.
Figure 24:
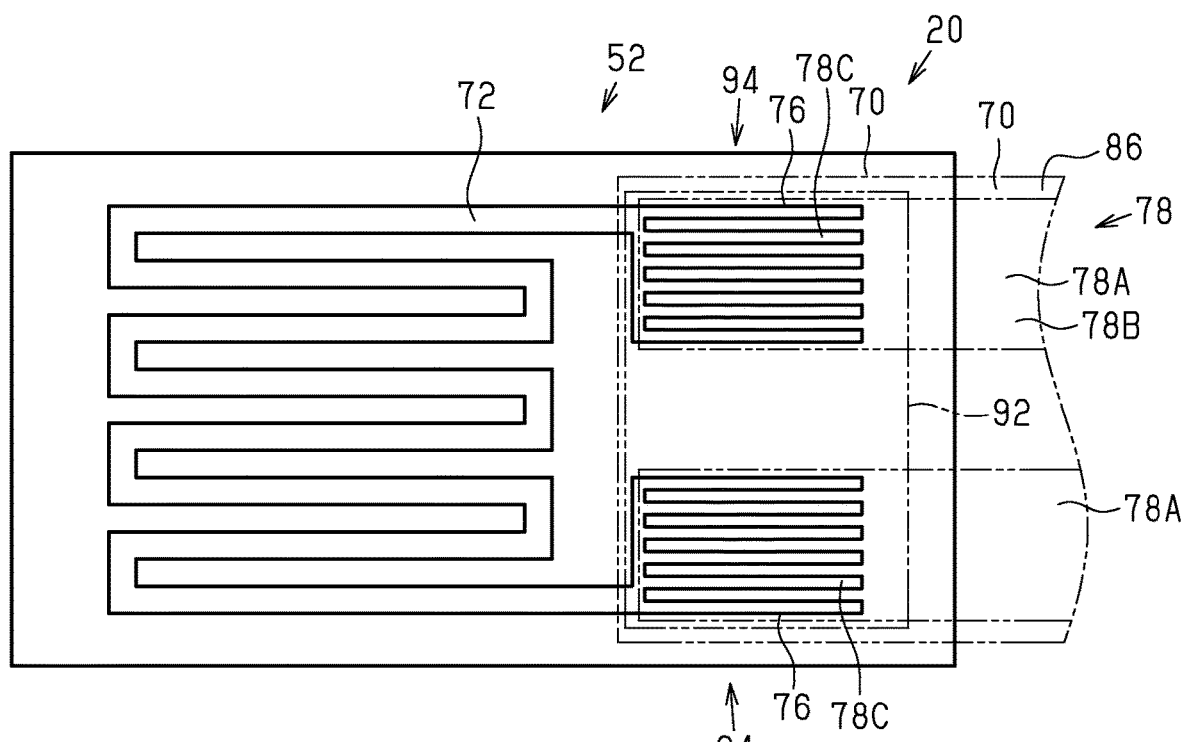
FIG. 24 is a plan view showing the relationship between a gauge terminal and a wire terminal of the strain gauge shown in FIG. 4.

As shown in FIG. 23, the substrate 70 can include the first setting surface 70A and a second setting surface 70B that are spaced apart in the thickness direction, the resistor 72 can be provided on the first setting surface 70A, and at least part of the gauge wire 74 can be provided on the second setting surface 70B. The substrate 70 can include the first setting surface 70A and the second setting surface 70B that are spaced apart in the thickness direction, the resistor 72 can be provided on the first setting surface 70A, and at least part of the electric wire 75 can be provided on the second setting surface 70B. A protective insulation layer 73 that covers the resistor 72 can be formed on the first setting surface 70A. The protective insulation layer 73 is electrically insulative. The substrate 70 can include the protective insulation layer 73. Preferably, the substrate 70 includes a first connection hole 70C that connects the first setting surface 70A and the second setting surface 70B, and part of the gauge wire 74 is provided in the first connection hole 70C. Preferably, the substrate 70 includes a connection hole 70D that connects the first setting surface 70A and the second setting surface 70B, and part of the electric wire 75 is provided in the connection hole 70D. The material of the part of the gauge wire 74 arranged in the first connection hole 70C can be the same as or differ from the material of the remaining part of the gauge wire 74. The material of the part of the electric wire 75 arranged in the connection hole 70D can be the same as or differ from the material of the remaining part of the electric wire 75.

Preferably, the gauge terminal 76 is molded integrally with the gauge wire 74. Preferably, the component 20 further includes a flexible printed wiring board 78 including a board 78B and the electric wire 78A. The board 78B is molded integrally with the substrate 70, and the electric wire 78A is provided on the board 78B. Further, the gauge terminal 76 is molded integrally with at least part of the electric wire 78A.

The component 20 can include the flexible printed wiring board 86 including the electric wire 78A. In a case where the strain gauge 52 is formed separately from the flexible printed wiring board 86, the gauge terminal 76 can be electrically connected to the electric wire 78A directly or by electrically conductive particles. In a case where the gauge terminal 76 is electrically connected to the electric wire 78A directly or by the electrically conductive particles, it is preferred that the component 20 shown in FIG. 24 further include an adhesive layer 92 that adheres the strain gauge 52 and the flexible printed wiring board 86 and that the adhesive layer 92 include the electrically conductive particles. The electric wire 78A includes a wire terminal 78C faced toward the gauge terminal 76, and one of the gauge terminal 76 and the wire terminal 78C is formed by a comb electrode 94. The gauge terminal 76 is connected to the wire terminal 78C, for example, by an ACF.

Modifications

The description related with the above embodiment exemplifies, without any intention to limit, an applicable form of a human-powered vehicle component according to the present disclosure. In addition to the embodiment described above, the human-powered vehicle component according to the present disclosure is applicable to, for example, modifications of the above embodiment that are described below and combinations of at least two of the modifications that do not contradict each other. In the modifications described hereafter, same reference numerals are given to those components that are the same as the corresponding components of the above embodiment. Such components will not be described in detail.

The present embodiment describes an example in which the component body 22 includes the crank assembly 22X, but the component body 22 can include at least one of the crank arm 24, the crank axle 26, the pedal 28, the frame 30, the handlebar 32, the stem 34, the front fork 36, the seatpost 38, the saddle 40, the wheel 42, the hub 44, a carrier 46, and a drive unit 48 configured to apply a propulsion force to the human-powered vehicle 10. The component body 22 can include, for example, only the first crank arm 24X or the second crank arm 24Y. The configuration of the strain gauge 52 can be changed in correspondence with the type or shape of the component body 22. In a case where the strain gauge 52 is attached to the pedal 28, for example, the strain gauge 52 is attached to the outer portion of a pedal shaft.

Figure 25:
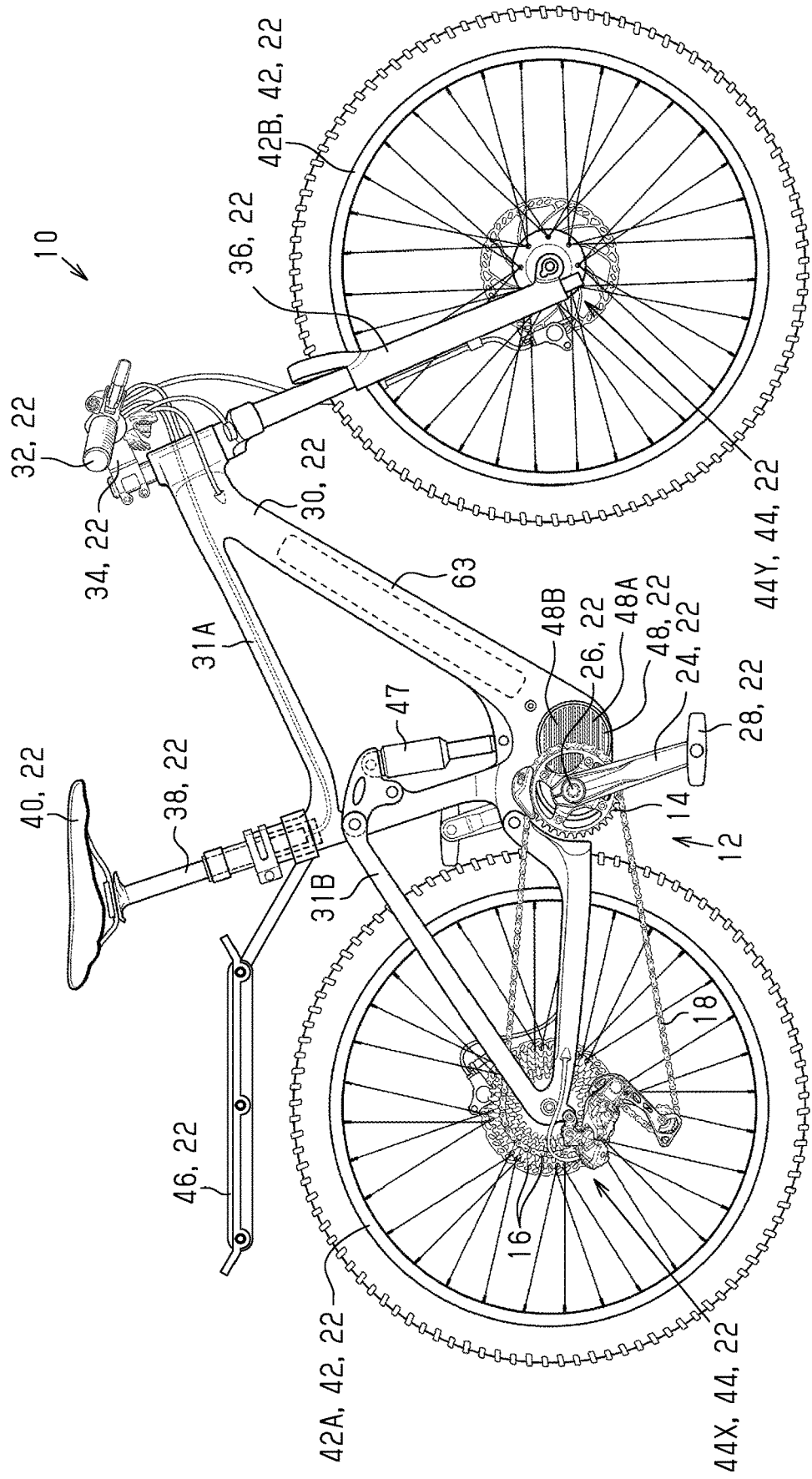
FIG. 25 is a side elevational view of a human-powered vehicle including a human-powered vehicle component in accordance with a modification.

FIG. 25 shows the human-powered vehicle 10 that is an electric assist bicycle. The basic structure of the human-powered vehicle 10 shown in FIG. 25 is similar to the structure of the human-powered vehicle 10 shown in FIG. 1. Thus, the description hereafter will focus on the differences. The human-powered vehicle 10 shown in FIG. 25 includes the drive unit 48, the carrier 46, and a rear suspension 47. The frame 30 includes a main frame 31A and a swingarm 31B. The swingarm 31B is pivotally coupled to the main frame 31A. The main frame 31A includes a top tube, a down tube, a seat tube, and a head tube. The swingarm 31B and the main frame 31A are coupled to the rear suspension 47. The rear wheel 42A is supported by the swingarm 31B. The crank axle 26 and the first rotational body 14 can be coupled to rotate integrally with each other or coupled by a second one-way clutch. The second one-way clutch is configured to rotate the first rotational body 14 forward in a case where the crank axle 26 is rotated forward and allow relative rotation of the crank axle 26 and the first rotational body 14 in a case where the crank axle 26 is rotated rearward. The carrier 46 is, for example, attached to the frame 30. The carrier 46 can be attached to the axle of the rear wheel 42A. The carrier 46 can include a wheel that is driven as the human-powered vehicle 10 travels.

The drive unit 48 includes a motor 48A. The motor 48A is configured to apply a propulsion force to the human-powered vehicle 10. The motor 48A includes one or more electric motors. The motor 48A is configured to transmit rotation to at least one of the front wheel 42B and the power transmission path of human driving force extending from the pedal 28 to the rear wheel 42A. The power transmission path of human driving force extending from the pedal 28 to the rear wheel 42A includes the rear wheel 42A. In the present embodiment, the motor 48A is provided on the frame 30 of the human-powered vehicle 10 to transmit rotation to the first rotational body 14. The motor 48A is provided on a housing 48B. The housing 48B is provided on the frame 30. The housing 48B is, for example, attached to the frame 30 in a detachable manner. The motor 48A and the housing 48B on which the motor 48A is provided define the drive unit 48. Preferably, a third one-way clutch is provided in the power transmission path between the motor 48A and the crank axle 26 so that the rotational force of the crank axle 26 is not transmitted to the motor 48A in a case where the crank axle 26 is rotated in the direction in which the human-powered vehicle 10 moves forward. In a case where the motor 48A is provided on at least one of the rear wheel 42A and the front wheel 42B, the motor 48A can be formed by a hub motor.

In a case where the component body 22 includes the drive unit 48, the substrate 70 is, for example, provided on a transferring member that transfers human driving force in the power transmission path between the crank axle 26 and the first rotational body 14. The transferring member is, for example, substantially cylindrical and located coaxially with the crank axle 26. One end of the transferring member in an axial direction of the crank axle 26 is coupled to the crank axle 26 in a manner restricting relative rotation. The other end of the transferring member in the axial direction of the crank axle 26 is coupled to the second one-way clutch or the first rotational body 14. In this case, the signal output 56 includes the wireless transmission device 60 and transmits information to a motor controller provided on the drive unit 48. The signal processing unit 54 can be included in the motor controller or electrically connected to the motor controller by at least one of a flexible printed wiring board and an electric cable.

In the human-powered vehicle 10 shown in FIG. 25, the power supply 63 is provided on the human-powered vehicle 10. The power supply 63 is, for example, connected to the signal processing unit 54 by an electric cable. The power supply 63 is, for example, provided on the frame 30. At least part of the power supply 63 can be, for example, incorporated in the down tube of the frame 30. The power supply 63 is configured to establish communication with a controller of the motor 48A through, for example, power line communication (PLC), Controller Area Network (CAN), or Universal Asynchronous Receiver/Transmitter (UART). In a case where the component body 22 includes at least one of the frame 30, the handlebar 32, the stem 34, the front fork 36, the seatpost 38, the saddle 40, the wheel 42, the hub 44, the carrier 46, and the drive unit 48, the electric power input 58 can be supplied with the electric power from the power supply 63 provided on the frame 30. In a case where the component body 22 includes at least one of the crank arm 24, the crank axle 26, and the pedal 28, the processor 62 can calculate the human driving force input to at least one of the crank arm 24, the crank axle 26, and the pedal 28 from the output of the strain gauge 52. In a case where the component body 22 includes at least one of the frame 30, the handlebar 32, the stem 34, the front fork 36, the wheel 42, the hub 44, and the drive unit 48, the processor 62 can calculate the human driving force input to at least one of the frame 30, the handlebar 32, the stem 34, the front fork 36, the wheel 42, the hub 44, and the drive unit 48 from the output of the strain gauge 52. In a case where the human-powered vehicle 10 includes the drive unit 48, and the strain gauge 52 is provided on a member located in the transmission path of human driving force at a portion where the propulsion force of the drive unit 48 is merged or at a downstream side of the portion where the propulsion force of the drive unit 48 is merged, the processor 62 can calculate a net force of the human driving force and the propulsion force of the drive unit 48. In a case where the component body 22 includes at least one of the handlebar 32, the stem 34, and the front fork 36, the processor 62 can calculate a steering force acting on at least one of the handlebar 32, the stem 34, and the front fork 36 from the output of the strain gauge 52. In a case where the component body 22 includes at least one of the handlebar 32, the stem 34, the front fork 36, the seatpost 38, the saddle 40, the wheel 42, and the carrier 46, the processor 62 can calculate load applied to at least one of the handlebar 32, the stem 34, the front fork 36, the seatpost 38, the saddle 40, the wheel 42, and the carrier 46, which is included in the component body 22. In other words, the strain gauge 52 is configured to output a signal corresponding to the force applied to the portion where the strain gauge 52 is provided, and the processor 62 is configured to calculate the force applied to the portion where the strain gauge 52 is provided. The power supply 63 can be, for example, configured to supply the motor 48A of the drive unit 48 with electric power. In a case where the transmission includes an electric transmission, the power supply 63 can be configured to supply, for example, the electric transmission of the drive unit 48 with electric power. In a case where the seatpost 38 includes an electric seatpost, the power supply 63 can be configured to supply, for example, the electric seatpost with electric power. In a case where at least one of the front fork 36 and the rear suspension 47 includes an electric suspension, the power supply 63 can be configured to supply, for example, the electric suspension with electric power.

In a case where the component body 22 includes at least one of the crank arm 24, the crank axle 26, the pedal 28, and the drive unit 48, the rotational state detector 66 can include, for example, a magnetic sensor that outputs a signal in accordance with magnetic strength. The magnetic sensor is, for example, configured to detect the magnetic force of the magnet M provided on the frame 30, the crank arm 24, or the crank axle 26. In a case where the component body 22 is the crank arm 24, the crank axle 26, or the pedal 28, the distance between the magnetic sensor and the magnet M is changed by the rotation of the component body 22. Thus, the magnetic sensor outputs a signal in accordance with the rotational speed of the component body 22. In a case where the component body 22 includes the frame 30, the magnetic sensor detects the magnetic force of the magnet M provided on at least one of the crank arm 24, the crank axle 26, and the pedal 28 to detect a relative rotational state of at least one of the crank arm 24, the crank axle 26, and the pedal 28 to the frame 30.

The rotational state detector 66 can be configured to detect a rotational state of any member as long as the member is rotated relative to the component body 22. The member that is rotated relative to the component body 22 is, for example, the crank arm 24, the crank axle 26, the pedal 28, the frame 30, the handlebar 32, the stem 34, the front fork 36, the seatpost 38, the saddle 40, the wheel 42, the hub 44, the carrier 46, or the drive unit 48, and is not included in the component body 22. In a case where the component body 22 includes a rotational member and a non-rotational member, the rotational state detector 66 can be configured to detect a rotational state of the relative rotation between the rotational member and the non-rotational member. For example, in a case where the component 20 includes the drive unit 48, the rotational state detector 66 can be configured to detect a rotational state of the relative rotation between the crank axle 26 and the housing 48B. Alternatively, the rotational state detector 66 can be configured to detect a rotational state of the relative rotation of the motor 48A and the housing 48B.

Figure 26:
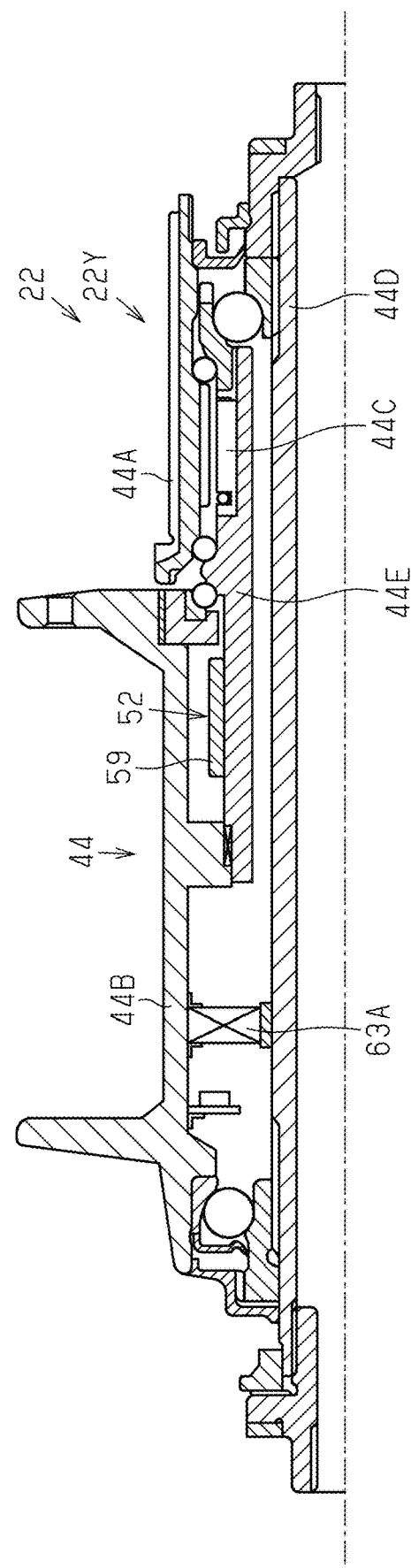
FIG. 26 is a cross-sectional view of the human-powered vehicle component in accordance with the modification.

As shown in FIG. 26, the component body 22 can be a component body 22Y including the hub 44. The hub 44 includes a first coupling member 44A, a hub shell 44B, a first one-way clutch 44C, a hub shaft 44D, and a second coupling member 44E. The first coupling member 44A, the hub shell 44B, the first one-way clutch 44C, and the second coupling member 44E are provided about the hub shaft 44D in a manner rotatable relative to the hub shaft 44D with one or more bearings located in between. The second rotational body 16 is coupled to an outer circumferential portion of the first coupling member 44A on. The first coupling member 44A is cylindrical, and the first one-way clutch 44C is located between an inner circumferential surface of the first coupling member 44A and the hub shaft 44D. Part of the second coupling member 44E is located between the first one-way clutch 44C and the hub shaft 44D. The first one-way clutch 44C can be a ratchet-type clutch or a roller clutch. The second coupling member 44E is cylindrical, and the first one-way clutch 44C is located between an outer circumferential portion of the second coupling member 44E and an inner circumferential portion of the first coupling member 44A. The second coupling member 44E is coupled to the hub shell 44B in a manner restricting rotation. The strain gauge 52 is provided in the power transmission path extending from the first coupling member 44A to the hub shell 44B. For example, the strain gauge 52 is provided on a member that is rotated integrally with the hub shell 44B. The strain gauge 52 is provided, for example, on the second coupling member 44E. The strain gauge 52 is provided on the second coupling member 44E between the portion coupled to the hub shell 44B and the portion coupled to the first one-way clutch 44C. The strain gauge 52 is adhered to the outer circumferential portion of the second coupling member 44E. The module 59 is provided on an inner circumferential portion of the hub shell 44B. The power supply 63 can include a battery or a dynamo 63A. The dynamo 63A includes, for example, a stator and a magnet. The stator is provided on the hub shell 44B or the second coupling member 44E and rotated integrally with the hub shell 44B. The magnet is fastened to the hub shaft 44D.

The processor 62 does not have to be provided on the substrate 70. The processor 62 can be provided on the external device 100.

The component 20 only needs to include the component body 22, a single substrate 70 provided on the component body 22, the resistor 72 formed on the substrate 70 and forming the strain gauge 52 with part of the substrate 70, the electric wire 75 formed on the substrate 70 and electrically connected to the resistor 72, the signal processing unit 54 formed or directly mounted on the substrate 70 and electrically connected to the electric wire 75, the signal output 56 that outputs a signal from the signal processing unit 54, and the electric power input 58 electrically connected to the signal processing unit 54 and supplied with electric power from the power supply 63 provided on at least one of the human-powered vehicle 10 and the component body 22. In this case, for example, the resistor 72 can be formed from a metal layer that is thicker than one micrometer. The signal processing unit 54 can include a communication device in addition to, or instead of, at least one of the temperature sensor 80, the amplifier 54A, the AD converter 54B, and the processor 62. The communication device can include the wireless transmission device 60 or a wired communication unit that is connected to the external device 100 by an electric cable.

The component 20 only needs to include the component body 22, a single substrate 70 provided on the component body 22, the resistor 72 formed on the substrate 70 and forming the strain gauge 52 with at least part of the substrate 70, the temperature sensor 80 formed or mounted on the substrate 70, the signal processing unit 54 electrically connected to the resistor 72, the signal output 56 that outputs a signal from the signal processing unit 54, and the electric power input 58 electrically connected to the signal processing unit 54 and supplied with electric power from the power supply 63 provided on at least part of the human-powered vehicle 10 and the component body 22. Further, the resistor 72 includes the first resistor 72A that forms the first strain gauge 52a with a first portion 70X of the substrate 70, and the second resistor 72B that forms the second strain gauge 52b with a second portion 70Y of the substrate 70. Furthermore, at least part of the temperature sensor 80 is arranged on the substrate 70 in the region R1 between the first resistor 72A and the second resistor 72B at a connecting portion that connects the first portion 70X and the second portion 70Y. In this case, other components can be omitted. For example, in a case where the strain gauge 52 includes a plurality of the strain gauges 52, the region R1 can be a region between the resistors 72 of two adjacent strain gauges or can be a region between the resistors 72 of strain gauges that are not adjacent to each other. Therefore, the temperature sensor 80 can be located in the position indicated by the double-dashed lines shown in FIG. 9.

The component 20 only needs to include the component body 22, a single substrate 70 provided on the component body 22, the resistor 72 formed on the substrate 70 and forming the strain gauge 52 with part of the substrate 70, the temperature sensor 80 formed or mounted on the substrate 70 and at least partially overlapped with the resistor 72 as viewed in the thickness direction of the substrate 70, the signal processing unit 54 electrically connected to the resistor 72, the signal output 56 that outputs a signal from the signal processing unit 54, and the electric power input 58 electrically connected to the signal processing unit 54 and supplied with electric power from the power supply 63 provided on at least one of the human-powered vehicle 10 and the component body 22 In this case, other components can be omitted. For example, the resistor 72 can be formed from a metal layer that is thicker than one micrometer.

The component 20 only needs to include the temperature sensor 80, the signal processing unit 54 electrically connected to the strain gauge 52, the signal output 56 that outputs a signal processing unital from the signal processing unit 54, and the electric power input 58 electrically connected to the signal processing unit 54 and supplied with electric power from the power supply 63 provided on at least one of the human-powered vehicle 10 and the component body 22. The temperature sensor 80 is provided on at least one of the component body 22, the strain gauge 52 provided on the component body 22, the electric circuit board 84, the flexible printed wiring board 86 electrically connecting the strain gauge 52 and the electric circuit board 84, the flexible printed wiring board 86, the first connecting portion 88A connecting the strain gauge 52 and the flexible printed wiring board 86, and the second connecting portion 88B connecting the flexible printed wiring board 86 and the electric circuit board 84. In this case, other components can be omitted. For example, the resistor 72 can be formed from a metal layer that is thicker than one micrometer. The temperature sensor 80 does not have to be included in the module 59.

The component 20 only needs to include the component body 22, the strain gauge 52 provided on the component body 22, the electric circuit board 84, the flexible printed wiring board 86 electrically connecting the strain gauge 52 and the electric circuit board 84, at least one of the amplifier 54A and the AD converter 54B, the signal processing unit 54 provided on the electric circuit board 84 and electrically connected to the at least one of the amplifier 54A and the AD converter 54B, the signal output 56 that outputs a signal from the signal processing unit 54, and the electric power input 58. Further, the at least one of the amplifier 54A and the AD converter 54B is electrically connected to the strain gauge 52 and provided on at least one of the flexible printed wiring board 86, the first connecting portion 88A connecting the strain gauge 52 and the flexible printed wiring board 86, and the second connecting portion 88B connecting the flexible printed wiring board 86 and the electric circuit board 84. Furthermore, the electric power input 58 is supplied with electric power from the power supply 63 provided on at least one of the human-powered vehicle 10 and the component body 22 and electrically connected to the signal processing unit 54 and to the at least one of the amplifier 54A and the AD converter 54B. In this case, other components can be omitted. For example, the resistor 72 can be formed from a metal layer that is thicker than one micrometer.

The component 20 only needs to include the component body 22, a single substrate 70 provided on the component body 22, the resistor 72 formed on the substrate 70 and forming the strain gauge 52 with part of the substrate 70, the electric wire 75 formed on the substrate 70 and electrically connected to the resistor 72, the signal processing unit 54 mounted on the substrate 70 and electrically connected to the electric wire 75, the signal output 56 that outputs a signal from the signal processing unit 54, and the electric power input 58 electrically connected to the signal processing unit 54 and supplied with electric power from the power supply 63 provided on at least one of the human-powered vehicle 10 and the component body 22. Further, the electric wire 75 has a lower electrical resistance per unit length than the resistor 72. In this case, other components can be omitted. For example, the resistor 72 can be formed from a metal layer that is thicker than one micrometer.

The component 20 only needs to include the component body 22, the strain gauge 52 provided on the component body 22, the signal processing unit 54 electrically connected to the strain gauge 52, the signal output 56 that outputs a signal from the signal processing unit 54, and the electric power input 58 electrically connected to the signal processing unit 54 and supplied with electric power from the power supply 63 provided on at least one of the human-powered vehicle 10 and the component body 22. Further, the strain gauge 52 includes the substrate 70 and the resistor 72 provided on the substrate 70. Furthermore, the resistor 72 is formed from a metal layer having a thickness of 0.01 micrometers or greater and 1 micrometer or less. In this case, other components can be omitted. For example, the signal processing unit 54 does not have to be mounted or formed on the substrate 70, and the temperature sensor 80 does not have to be mounted or formed on the substrate 70.

The component 20 only needs to include the component body 22, the strain gauge 52 provided on the component body 22, the signal processing unit 54 electrically connected to the strain gauge 52, the signal output 56 that outputs a signal from the signal processing unit 54, and the electric power input 58 electrically connected to the signal processing unit 54 and supplied with electric power from the power supply 63 provided on at least one of the human-powered vehicle 10 and the component body 22. Further, the strain gauge 52 includes the substrate 70, the resistor 72 provided on the substrate 70, and the gauge wire 74 provided on the substrate 70 and electrically connected to the resistor 72. Furthermore, the gauge wire 74 has a lower electrical resistance per unit length than the resistor 72. In this case, other components can be omitted. For example, the resistor 72 can be formed from a metal layer that is thicker than one micrometer. For example, the signal processing unit 54 does not have to be mounted or formed on the substrate 70, and the temperature sensor 80 does not have to be mounted or formed on the substrate 70.

The component 20 only needs to include the component body 22, the strain gauge 52 provided on the component body 22, the flexible printed wiring board 86 including the electric wire 75, the signal processing unit 54 electrically connected to the strain gauge 52 by the electric wire 75 of the flexible printed wiring board 86, the signal output 56 that outputs a signal from the signal processing unit 54, and the electric power input 58 electrically connected to the signal processing unit 54 and supplied with electric power from the power supply 63 provided on at least one of the human-powered vehicle 10 and the component body 22. Further, the strain gauge 52 includes the substrate 70, the resistor 72 provided on the substrate 70, and the gauge terminal 76 provided on the substrate 70 and electrically connected to the resistor 72. Furthermore, the gauge terminal 76 is electrically connected to the electric wire 75 directly or by electrically conductive particles. In this case, other components can be omitted. For example, the resistor 72 can be formed from a metal layer that is thicker than one micrometer. For example, the signal processing unit 54 does not have to be mounted or formed on the substrate 70, and the temperature sensor 80 does not have to be mounted or formed on the substrate 70.

The phrase "at least one of" as used in this disclosure means "one or more" of a desired choice. For one example, the phrase "at least one of" as used in this disclosure means "only one single choice" or "both of two choices" if the number of its choices is two. For another example, the phrase "at least one of" as used in this disclosure means "only one single choice" or "any combination of equal to or more than two choices" if the number of its choices is equal to or more than three.

What is claimed is:

1. A component for a human-powered vehicle, the component comprising:
    a component body;
    a single substrate provided on the component body, the single substrate including a first setting surface and a second setting surface that are spaced apart in a thickness direction, the single substrate further including a connection hole that connects the first setting surface and the second setting surface;
    a resistor formed on the single substrate and forming a strain gauge with part of the single substrate, the resistor being provided on the first setting surface;
    an electric wire formed on the single substrate and electrically connected to the resistor, at least part of the electric wire being provided on the second setting surface and part of the electric wire being provided in the connection hole;
    a signal processing unit formed or directly mounted on the single substrate and electrically connected to the electric wire;
    a signal output that outputs a signal from the signal processing unit; and
    an electric power input electrically connected to the signal processing unit and supplied with electric power from a power supply provided on at least one of the human-powered vehicle and the component body.

2. The component according to claim 1, wherein the signal processing unit includes at least one of an amplifier and an AD converter.

3. The component according to claim 1, further comprising
    a temperature sensor formed or mounted on the single substrate.

4. The component according to claim 3, wherein
    the resistor includes a first resistor and a second resistor, and
    at least part of the temperature sensor is disposed on the single substrate in a region between the first resistor and the second resistor.

5. A component for a human powered vehicle, the component comprising:
    a component body;
    a single substrate provided on the component body;
    a resistor formed on the single substrate and forming a strain gauge with at least part of the single substrate;
    a temperature sensor formed or mounted on the single substrate, the temperature sensor being arranged so as not to overlap the resistor;
    a signal processing unit electrically connected to the resistor;
    a signal output that outputs a signal from the signal processing unit; and
    an electric power input electrically connected to the signal processing unit and supplied with electric power from a power supply provided on at least one of the human-powered vehicle and the component body,
    the resistor including
        a first resistor forming a first strain gauge with a first portion of the single substrate, and
        a second resistor forming a second strain gauge with a second portion of the single substrate,
    at least part of the temperature sensor being disposed on the single substrate in a region between the first resistor and the second resistor on the single substrate at a connecting portion connecting the first portion and the second portion.

6. The component according to claim 3, wherein
    at least part of the temperature sensor is arranged to overlap at least part of resistor as viewed in a thickness direction of the single substrate.

7. A component for a human-powered vehicle, the component comprising:
    a component body;
    a single substrate provided on the component body;
    a resistor formed on the single substrate and forming a strain gauge with part of the single substrate;
    an electric wire formed on the single substrate and electrically connected to the resistor, the electric wire including a first wire portion and a second wire portion that covers the first wire portion, the second wire portion having a lower electrical resistivity than the resistor and the first wire portion;
    a temperature sensor formed or mounted on the single substrate and disposed to at least partially overlap the resistor as viewed in a thickness direction of the single substrate;
    a signal processing unit electrically connected to the resistor;
    a signal output that outputs a signal from the signal processing unit; and
    an electric power input electrically connected to the signal processing unit and supplied with electric power from a power supply provided on at least one of the human-powered vehicle and the component body,
    the resistor being molded integrally with the first wiry, portion of the electric wire.

8. A component for a human-powered vehicle, the component comprising:
    a component body;
    a strain gauge provided on the component body, the strain gauge including a resistor and afirst thermal conductor that is electrically insulated from the resistor;
    an electric circuit board;
    a flexible printed wiring board electrically connecting the strain gauge and the electric circuit board, the flexible printed wiring board including a second thermal conductor connected to the first thermal conductor;
    a temperature sensor provided on the flexible printed wiring board, the temperature sensor being disposed in contact with or proximate to the second thermal conductor;
    a signal processing unit electrically connected to the strain gauge;
    a signal output that outputs a signal from the signal processing unit; and
    an electric power input electrically connected to the signal processing unit and supplied with electric power from a power supply provided on at least one of the human-powered vehicle and the component body.

9. The component according to claim 8, further comprising
an at least one of an amplifier and an AD converter,
the at least one of the amplifier and the AD converter being electrically connected to the strain gauge and being provided on at least one of the flexible printed wiring board, the first connecting portion, and the second connecting portion.

10. A component for a human-powered vehicle, the component comprising:
a component body;
a strain gauge provided on the component body;
an electric circuit board:
a flexible printed wiring board electrically connecting the strain gauge and the electric circuit board;
at least one of an amplifier and an AD converter electrically connected to the strain gauge and provided on at least one of the flexible printed wiring board, a first connecting portion to which the strain gauge and the flexible printed wiring board are connected, and a second connecting portion to which the flexible printed wiring board and the electric circuit board are connected;
a signal processing unit provided on the electric circuit board and electrically connected to the at least one of the amplifier and the AD converter;
a signal output that outputs a signal from the signal processing unit; and
an electric power input electrically connected to the signal processing unit and the at least one of the amplifier and the AD converter and supplied with electric power from a power supply provided on at least one of the human-powered vehicle and the component body.

11. The component according to claim 1, wherein
the electric wire has a lower electrical resistance per unit length than the resistor.

12. A component for a human-powered vehicle, the component comprising:
a component body;
a single substrate provided on the component body;
a resistor formed on the single substrate and tbrming a strain gauge with part of the single substrate;
an electric wire formed on the single substrate and electrically connected to the resistor, the electric wire including a first wire portion and a second wire portion that covers the first wire portion, the second wire portion having a lower electrical resistivity than the resistor and the first wire portion;
a signal processing unit mounted on the single substrate and electrically connected to the electric wire;
a signal output that outputs a signal from the signal processing unit; and
an electric power input electrically connected to the signal processing unit and supplied with electric power from a power supply provided on at least one of the human-powered vehicle and the component body,
the electric wire having a lower electrical resistance per unit length than the resistor, and
the resistor being molded integrally with the first wire portion of the electric wire.

13. The component according to claim 11, wherein
the resistor and the electric wire have different compositions.

14. The component according to claim 13, wherein
the resistor includes at least one of CuNi, Ni, and NiCr, and
at least part of the electric wire includes Cu.

15. The component according to claim 1, wherein
the single substrate includes an insulative and flexible resin film.

16. The component according to claim 1, wherein
the signal output includes a wireless transmission device that transmits information corresponding to a signal from the signal processing unit through wireless connection.

17. The component according to claim 1, further comprising:
a processor provided on at least one of the component body and the signal processing unit,
the processor being configured to calculate information related to force applied to the component body.

18. The component according to claim 17, further comprising
an operating unit provided on the component body to input a reset signal to the processor.

19. The component according to claim 1, further comprising
a rotational state detector that detects a rotational state of at least part of the component body.

20. The component according to claim 1, further comprising
a notification device provided on the component body, and including at least one of a light generation device and a sound generation device.

21. The component according to claim 1, further comprising
a cover provided on the component body to define a sealed space in which at least the strain gauge and the signal processing unit are disposed.

22. The component according to claim 1, wherein
the component body includes at least one of a crank assembly, a crank arm, a crank axle, a pedal, a frame, a handlebar, a stem, a front fork, a seatpost, a saddle, a wheel, a hub, a carrier, and a drive unit configured to apply a propulsion force to the human-powered vehicle.

* * * * *